(12) United States Patent
Kinose et al.

(10) Patent No.: US 6,858,300 B2
(45) Date of Patent: Feb. 22, 2005

(54) RED PHOSPHORUS-BASE FLAME RETARDANT FOR EPOXY RESINS, RED PHOSPHORUS-BASE FLAME RETARDANT COMPOSITIONS THEREFOR, PROCESSES FOR THE PRODUCTION OF BOTH, EPOXY RESIN COMPOSITIONS FOR SEALING FOR SEMICONDUCTOR DEVICES, SEALANTS AND SEMICONDUCTOR DEVICES

(75) Inventors: Yutaka Kinose, Tokyo (JP); Ryohei Imamura, Tokyo (JP); Akinori Inoue, Tokyo (JP); Toru Hata, Tokyo (JP); Eriko Okuno, Tokyo (JP)

(73) Assignee: Nippon Chemical Industrial Co., LTD, Tokyo (JP)

( * ) Notice: Subject to any disclaimer, the term of this patent is extended or adjusted under 35 U.S.C. 154(b) by 0 days.

(21) Appl. No.: 10/275,960

(22) PCT Filed: May 24, 2001

(86) PCT No.: PCT/JP01/04363

§ 371 (c)(1),
(2), (4) Date: Nov. 18, 2002

(87) PCT Pub. No.: WO01/90242

PCT Pub. Date: Nov. 29, 2001

(65) Prior Publication Data

US 2003/0197159 A1 Oct. 23, 2003

(30) Foreign Application Priority Data

May 25, 2000 (JP) .......................... 2000-154084
Dec. 18, 2000 (JP) .......................... 2000-383703
Mar. 5, 2001 (JP) .......................... 2001-060647

(51) Int. Cl.$^7$ ............................................. B32B 09/04
(52) U.S. Cl. ..................... 428/407; 428/403; 428/413; 428/921; 252/601; 252/604; 252/609; 523/204; 523/205; 524/414
(58) Field of Search ................. 252/601, 604, 252/609, 610; 428/403, 407, 413, 920, 921; 523/451, 205, 204, 200; 524/414, 80; 427/443.2, 407.1, 419.2, 419.5

(56) References Cited

U.S. PATENT DOCUMENTS 5,543,444 A * 8/1996 Kobayashi et al. .......... 523/205
6,248,814 B1 * 6/2001 Hironaka et al. ............. 524/80

FOREIGN PATENT DOCUMENTS

| EP | 783025 | 7/1997 |
|---|---|---|
| JP | 61-152746 | 7/1986 |
| JP | 62-21704 | 1/1987 |
| JP | 4-130007 | 5/1992 |
| JP | 7-157542 | 6/1995 |
| JP | 7-173372 | 7/1995 |
| JP | 8-151427 | 6/1996 |
| JP | 8-245214 | 9/1996 |
| JP | 9-227765 | 9/1997 |
| JP | 10-152599 | 6/1998 |
| JP | 10-182940 | 7/1998 |

OTHER PUBLICATIONS

English Translation, JP–04–130007, Mita et al., Aug. 6, 1996.*

* cited by examiner

Primary Examiner—David J. Buttner
Assistant Examiner—Christopher Keehan
(74) Attorney, Agent, or Firm—Westerman, Hattori, Daniels & Adrian, LLP

(57) ABSTRACT

The red phosphorus base flame retardant for an epoxy resin is provided, which has red phosphorus particles coated with a thermosetting resin containing an anhydrous zinc compound. The coated red phosphorus has properties that a slurry having the coated red phosphorus dispersed in 10% by weight into water at 20° C. has an electric conductivity of 30 $\mu$s/cm or below, the slurry having been left standing at 80° C. for 20 hours has an electric conductivity of 150 $\mu$s/cm or below, and when 80 ml of water is added to 8 g of the coated red phosphorus and heated at 80° C. for 20 hours, a concentration of $PO_4$ ions eluted is 10 ppm or below.

51 Claims, No Drawings

RED PHOSPHORUS-BASE FLAME RETARDANT FOR EPOXY RESINS, RED PHOSPHORUS-BASE FLAME RETARDANT COMPOSITIONS THEREFOR, PROCESSES FOR THE PRODUCTION OF BOTH, EPOXY RESIN COMPOSITIONS FOR SEALING FOR SEMICONDUCTOR DEVICES, SEALANTS AND SEMICONDUCTOR DEVICES

TECHNICAL FIELD

The present invention relates to a red phosphorus base flame retardant for an epoxy resin, its production method, a red phosphorus base flame-retardant composition for an epoxy resin, its production method, an epoxy resin composition for a semiconductor sealing material using them, a sealing material and a semiconductor device, and more particularly to a flame retardant which is useful to impart flame retardancy to an epoxy resin, particularly an epoxy resin for semiconductor sealing, which suppresses the phosphoric acid ions from eluting from the red phosphorus base flame retardant and used in fields where electric reliability is required, its production method, a flame-retardant composition, an epoxy resin composition for a semiconductor sealing material using the flame-retardant composition and excelling in flame retardancy, humidity resistance and electric reliability, a sealing material and a semiconductor device.

BACKGROUND ART

A sealing material protects semiconductor ICs from moisture, dust and the like contained in the air and facilitates handling of semiconductor ICs. The epoxy resin sealing material is mostly used now. Conventionally, as the flame retardant for an epoxy resin sealing material, a halogenated epoxy resin or a combination of a halogenated epoxy resin and an antimony trioxide has been employed. In recent years, however, global environmental pollution problems and health hazards have emerged, and the demands for non-halogen base flame retardants have increased. And, halogen compounds of chlorine, bromine, etc. and antimony trioxide tend not to be used.

As a non-halogen base flame retardant, red phosphorus is a promising flame retardant, but it has disadvantages that a small amount of phosphine gas is produced by a reaction of red phosphorus and moisture in the air and oxo acid of phosphorus elutes from the red phosphorus surface.

When oxo acid of phosphorus eluted from the red phosphorus surface comes into contact with a semiconductor IC circuit, aluminum wiring is corroded, becoming a cause of lowering the reliability. Reduction of the eluted ions was a serious issue when the red phosphorus base flame retardant is used for the epoxy resin sealing material.

A lot of studies have been made on the problem of generation of phosphine from red phosphorus, and there have been proposed various methods of lowering the volume of phosphine generated by coating the surface of red phosphorus with hydroxide of inorganic metal such as aluminum or titanium, or coating with an organic compound such as a phenol resin or a melamine resin, or dual-coating with an inorganic compound and an organic compound.

But, oxo acid of phosphorus elutes from the surface of red phosphorus although it is coated as described above, and it was difficult to use the surface-coated red phosphorus in fields where laminated sheets, semiconductor sealing materials, etc. are required to have electric reliability. For example, when a red phosphorus base flame retardant is used for an epoxy resin for semiconductor sealing, there is a problem that a sealing material reliability test reveals that IC circuits are corroded with oxo acid of phosphorus eluted from red phosphorus resulting in lowering the reliability.

One of causes of the elution of oxo acid of phosphorus from red phosphorus is assumed that even if a method of coating the surface of red phosphorus particles is appropriate, when an epoxy resin sealing material is produced by mixing and blending red phosphorus with other materials, e.g., an epoxy resin, a phenol resin base curing agent, a silica filler, etc., the coating layer on red phosphorus is peeled because red phosphorus particles are exposed to a mechanical frictional force and a shearing force, and red phosphorus comes into direct contact with water at peeled portions to induce the elution of oxo acid of phosphorus. In such a case, the sealing material often fails the reliability test.

To provide a red phosphorus base flame retardant for a semiconductor sealing epoxy resin, there have been proposed for example a method of using red phosphorus which is coated its surface with a phenol resin and further coated with an epoxy-silane-coupling agent and an amino-silane-coupling agent and also melamine polyphosphate (Japanese Patent Application Laid-open Print No. 10-182940), a method of using a red phosphorus base flame retardant which has the surface layer of red phosphorus coated with $Ti_xO_y$ (x, y are a positive number, x:y=1:2 to 1:4) (Japanese Patent Application Laid-open Print No. 7-173372), a method of using a red phosphorus base flame retardant having an average particle size of 2 to 8 $\mu$m and a maximum particle size of 20 $\mu$m or below which has the surface layer of red phosphorus coated with aluminum hydroxide and further coated with a phenol resin (Japanese Patent Application Laid-open Print No. 10-152599), and a method of using a red phosphorus base flame retardant which has the surface layer of red phosphorus coated with $Si_xO_y$ (X, Y are a positive number, X:Y=1:2 to 1:4) (Japanese Patent Application Laid-open Print No. 7-157542).

There is also proposed a method of using a coated red phosphorus base flame retardant and an ion-trapping agent of $BiO_x(OH)_y(NO_3)_z$(X=0.9 to 1.1, Y=0.6 to 0.8, Z=0.2 to 0.4) and $Mg_{4.3}Al_2(OH)_{12.6}CO_3.3.5H_2O$ (Japanese Patent Application Laid-open Print No. 8-151427, and Japanese Patent Application Laid-open Print No. 9-227765).

But, when the coated red phosphorus base flame retardant is used to produce an epoxy resin sealing material, the coating layer on red phosphorus is peeled because the red phosphorus particles are exposed to a mechanical frictional force and a shearing force, and red phosphorus comes into direct contact with water at peeled portions to induce the elution of oxo acid of phosphorus. Therefore, there is an issue of trapping the eluted oxo acid of phosphorus to lower its action. But, the issue has not been practically solved yet because the aforesaid method of jointly using the ion-trapping agent is poor in trapping oxo acid of phosphorus.

Japanese Patent Application Laid-open Print. No. 62-21704 proposes coated red phosphorus for a flame retardant which is produced by coating the surface of red phosphorus particles with Al and/or Zn hydroxide and further coating with a thermosetting resin containing zinc hydroxide and has improved humidity resistance and corrosion resistance.

Because zinc hydroxide of Japanese Patent Application Laid-open Print No. 62-21704 is a hydrate, when stabilized red phosphorus using zinc hydroxide is used as a flame retardant for a semiconductor sealing epoxy resin, water is produced as zinc hydroxide is decomposed by a reliability test of the semiconductor sealing material at a high temperature, and red phosphorus comes into direct contact with water to elute oxo acid of phosphorus. Zinc hydroxide itself is also soluble in water at about 0.52 mg/100 ml at 18° C. It is hard to industrially obtain high-purity zinc hydroxide not containing an ionic impurity. The stabilized red phosphorus obtained by the production method of Japanese Patent Application Laid-open Print No. 62-21704 is produced by adding water-soluble metallic salt to a slurry which has red phosphorus particles dispersed into water, further adding an alkaline agent to deposit a metallic oxide or hydroxide on the surface of red phosphorus particles to obtain red phosphorus coated with an inorganic substance, after completing the reaction without washing the inorganic substance-coated red phosphorus, directly adding zinc hydroxide and a synthetic material of a thermosetting resin or its prepolymer to the slurry containing an ionic impurity having an electric conductivity of 10000 $\mu$s/cm or more, and making a polymerization reaction under the polymerization condition of the thermosetting resin monomer. The stabilized red phosphorus obtained as described above has a large amount of ionic impurities taken into coated resin at the time of the polymerization reaction, and it is hard to remove the ionic impurities from the resin by washing afterward. If washing is repeated to forcedly lower the electric conductivity, the surface coating of the red phosphorus particles is broken, increasing an eluting amount of oxo acid of phosphorus, and especially, when the stabilized red phosphorus is used as a flame retardant for the epoxy resin composition for the sealing material, electric reliability is lowered due to the elution of the ionic impurities from the resin. Thus, it had a disadvantage to be used as a flame retardant for the semiconductor sealing epoxy resin.

Japanese Patent Application Laid-open Print No. 4-130007 proposes stabilized red phosphorus which has the surface of red phosphorus particles coated with a composite film of a thermosetting resin and at least one substantially anhydrous metal oxide selected from zinc oxide, aluminum oxide and titanium oxide.

But, the stabilized red phosphorus of Japanese Patent Application Laid-open Print No. 4-130007 is used as a flame retardant for the polyolefin resin coating material for communications cables and electric cables, and when the stabilized red phosphorus is used as a flame retardant for a semiconductor sealing epoxy resin, it has a drawback that stable electric reliability cannot be proved by a reliability test of the semiconductor sealing material because an electric conductivity and the like of the stabilized red phosphorus are not specified.

In view of the aforesaid circumstances, the inventors have made a devoted study on a red phosphorus base flame retardant which is applicable to a semiconductor sealing material, and found that in a red phosphorus base flame retardant which has an anhydrous zinc compound contained in a thermosetting resin for coating red phosphorus particles or a red phosphorus base flame-retardant Composition which is formed of a mixture containing flame-retardant stabilized red phosphorus and an anhydrous zinc compound, the anhydrous zinc compound effectively reacts with oxo acid of phosphorus to form an insoluble phosphate compound to fix on its surface, the red phosphorus base flame retardant or the red phosphorus base flame-retardant composition is particularly treated by washing or the like to remove ionic impurities so to have a particular low electric conductivity, so that the red phosphorus base flame retardant or the red phosphorus base flame-retardant composition can be used suitably as a flame retardant for a semiconductor sealing resin, and completed the present invention.

Thus, it is an object of the present invention to provide a red phosphorus base flame retardant for an epoxy resin, an epoxy resin composition for a semiconductor sealing material and their production methods, which can suppress oxo acid of phosphorus from eluting from red phosphorus of the red phosphorus base flame retardant or the flame-retardant stabilized red phosphorus and can impart excellent flame retardancy to the epoxy resin for the semiconductor sealing material.

It is also an object of the present invention to provide an epoxy resin composition for a semiconductor sealing material which uses the red phosphorus base flame retardant, for an epoxy resin and an epoxy resin composition for a semiconductor sealing material and has excellent flame retardancy, humidity resistance and electric reliability, and a sealing material and a semiconductor device using the above epoxy resin composition.

DISCLOSURE OF INVENTION

A first aspect of the invention is directed to a red phosphorus base flame retardant for an epoxy resin (hereinafter called the red phosphorus base flame retardant (1) for an epoxy resin), its production method, an epoxy resin composition for a semiconductor sealing material containing the red phosphorus base flame retardant (1) for an epoxy resin, a masterbatch for the epoxy resin composition for a semiconductor sealing material, a semiconductor sealing material formed of the epoxy resin composition, and a semiconductor device using the semiconductor sealing material.

Specifically, the red phosphorus base flame retardant (1) for an epoxy resin of the first aspect of the invention comprises coated red phosphorus which has the surface of red phosphorus particles coated with a thermosetting resin containing an anhydrous zinc compound, wherein the coated red phosphorus has properties that its slurry prepared by dispersing in 10% by weight into water at 20° C. has an electric conductivity of 30 $\mu$s/cm or below, the slurry which is left standing at 80° C. for 20 hours has an electric conductivity of 150 $\mu$s/cm or below, and when 80 ml of water is added to 8 g of the coated red phosphorus and heated at 80° C. for 20 hours, a concentration of $PO_4$ ions eluted is 10 ppm or below.

Besides, it is preferable that the above coated red phosphorus has properties that its slurry prepared by dispersing in 10% by weight into water and left standing at 150° C. for 20 hours has an electric conductivity of 2000 $\mu$s/cm or below, and when 80 ml of water is added to 8 g of the coated red phosphorus and heated at 150° C. for 20 hours a concentration of $PO_4$ ions eluted is 800 ppm or below.

In addition, it is preferable that the coated red phosphorus has properties that when 80 ml of water is added to 8 g of coated red phosphorus and heated at 80° C. for 20 hours, a concentration of $PHO_3$ ions eluted is 300 ppm or below and when heated at 150° C. for 20 hours, a concentration of $PHO_3$ ions eluted is 1500 ppm or below.

A method of manufacturing the red phosphorus base flame retardant (1) for an epoxy resin of the first aspect of the invention has the following steps (A1) to (A3).

(A1) Step of washing red phosphorus particles with at least one or more selected from acids and alkalis.

(A2) Step of obtaining coated red phosphorus by adding an anhydrous zinc compound and a synthetic material of a thermosetting resin or its prepolymer to a slurry having the washed red phosphorus particles dispersed into water, and performing a polymerization reaction to coat the surface of red phosphorus particles with the thermosetting resin containing the anhydrous zinc compound.

(A3) Step of obtaining the red phosphorus base flame retardant (1) for an epoxy resin by washing the coated red phosphorus with pure water so that a slurry having the coated red phosphorus dispersed in 10% by weight into water at 20° C. has an electric conductivity of 30 $\mu$s/cm or below.

The epoxy resin composition for a semiconductor sealing material of the first aspect of the invention contains the aforesaid red phosphorus base flame retardant (1) for an epoxy resin.

The masterbatch for an epoxy resin composition for a semiconductor sealing material of the first aspect of the invention contains the aforesaid red phosphorus base flame retardant for an epoxy resin within a resin.

The semiconductor sealing material of the first aspect of the invention uses the aforesaid epoxy resin composition for a semiconductor sealing material.

The semiconductor device of the first aspect of the invention uses the aforesaid semiconductor sealing material.

A second aspect of the invention is directed to a red phosphorus base flame retardant for an epoxy resin (hereinafter called the red phosphorus base flame retardant (2) for an epoxy resin), its production method, an epoxy resin composition for a semiconductor sealing material containing the red phosphorus base flame retardant (2) for an epoxy resin, a masterbatch for the epoxy resin composition for a semiconductor sealing material, a semiconductor sealing material formed of the epoxy resin composition, and a semiconductor device using the above semiconductor sealing material.

Specifically, the red phosphorus base flame retardant (2) for an epoxy resin of the second aspect of the invention comprises double-coated red phosphorus which has the surface of red phosphorus particles coated with an inorganic substance and further coated with a thermosetting resin containing an anhydrous zinc compound, wherein the double-coated red phosphorus has properties that its slurry prepared by dispersing in 10% by weight into water at 20° C. has an electric conductivity of 30 $\mu$s/cm or below, the slurry which is left standing at 80° C. for 20 hours has an electric conductivity of 150 $\mu$s/cm or below, and when 80 ml of water is added to 8 g of the double-coated red phosphorus and heated at 80° C. for 20 hours, a concentration of $PO_4$ ions eluted is 10 ppm or below.

Besides, it is preferable that the double-coated red phosphorus has properties that its slurry prepared by dispersing in 10% by weight into water and left standing at 150° C. for 20 hours has an electric conductivity of 2000 $\mu$s/cm or below, and when 80 ml of water is added to 8 g of the double-coated red phosphorus and heated at 150° C. for 20 hours a concentration of $PO_4$ ions eluted is 800 ppm or below.

In addition, it is preferable that the double-coated red phosphorus has properties that when 80 ml of water is added to 8 g of double-coated red phosphorus and heated at 80° C. for 20 hours, a concentration of $PHO_3$ ions eluted is 300 ppm or below eluted, and when heated at 150° C. for 20 hours, a concentration of $PHO_3$ ions eluted is 1500 ppm or below.

A method of manufacturing the red phosphorus base flame retardant (2) for an epoxy resin of the second aspect of the invention has the following steps (B1) to (B5).

(B1) Step of washing red-phosphorus particles with at least one or more selected from acids and alkalis.

(B2) Step of coating the surface of red phosphorus particles with an inorganic substance formed of metal hydroxide or oxide by adding a water-soluble metallic salt and an alkaline agent to a slurry having the washed red phosphorus particles into water.

(B3) Step of washing the red phosphorus particles coated with the inorganic substance with pure water.

(B4) Step of obtaining double-coated red phosphorus by adding an anhydrous zinc compound and a synthetic material of a thermosetting resin or its prepolymer to a slurry having the washed red phosphorus particles coated with the inorganic substance dispersed into water, and performing a polymerization reaction to coat the surface of red phosphorus particles, which is coated with the inorganic substance, with the thermosetting resin containing the anhydrous zinc compound.

(B5) Step of obtaining the red phosphorus base flame retardant (2) for an epoxy resin by washing the double-coated red phosphorus with pure water so that a slurry having the double-coated red phosphorus dispersed in 10% by weight into water at 20° C. has an electric conductivity of 30 $\mu$s/cm or below.

The epoxy resin composition for a semiconductor sealing material of the second aspect of the invention contains the aforesaid red phosphorus base flame retardant (2) for an epoxy resin.

The masterbatch for the epoxy resin composition for a semiconductor sealing material of the second aspect of the invention contains the aforesaid red phosphorus base flame retardant for an epoxy resin within a resin.

The semiconductor sealing material of the second aspect of the invention uses the aforesaid epoxy resin composition for a semiconductor sealing material The semiconductor device of the second aspect of the invention uses the aforesaid semiconductor sealing material.

A third aspect of the invention is directed to a red phosphorus base flame-retardant composition for an epoxy resin (hereinafter called the red phosphorus base flame-retardant composition (3) for an epoxy resin), its production method, an epoxy resin composition for a semiconductor sealing material containing the red phosphorus base flame-retardant composition (3) for an epoxy resin, a masterbatch for an epoxy resin composition for a semiconductor sealing material, a semiconductor sealing material formed of the above epoxy resin composition, and a semiconductor device using the above semiconductor sealing material.

Specifically, the red phosphorus base flame-retardant composition (3) for an epoxy resin of the third aspect of the invention comprises a red phosphorus mixture containing an anhydrous zinc compound and flame-retardant stabilized red phosphorus which has the surface of red phosphorus particles coated with at least one kind selected from thermosetting resins and inorganic substances and has an electric conductivity of 30 $\mu$s/cm or below to a slurry prepared by dispersing the coated red phosphorus particles in 10% by weight into water at 20° C., wherein the red phosphorus mixture has properties that when it is dispersed in 10% by weight into water and a prepared slurry is left standing at 80° C. for 20 hours, its electric conductivity is 150 $\mu$s/cm or below, and when 80 ml of water is added to 8 g of the red phosphorus mixture and heated at 80° C. for 20 hours, a concentration of $PO_4$ ions eluted is 10 ppm or below.

Besides, it is preferable that the red phosphorus mixture has properties that a slurry which is prepared by dispersing the red phosphorus mixture in 10% by weight into water and left standing at 150° C. for 20 hours has an electric conductivity of 2000 µs/cm or below, and when 80 ml of water is added to 8 g of the red phosphorus mixture and heated at 150° C. for 20 hours, a concentration of $PO_4$ ions eluted is 800 ppm or below.

In addition, it is preferable that the red phosphorus mixture has properties that when 80 ml of water is added to 8 g of red phosphorus mixture and heated at 80° C. for 20 hours, a concentration of $PHO_3$ ions eluted is 300 ppm or below and when heated at 150° C. for 20 hours, a concentration $PHO_3$ ions eluted is 1500 ppm or below.

The method of manufacturing the red phosphorus base flame-retardant composition (3) for an epoxy resin of the third aspect of the invention has the following steps (C1) to (C6).

(C1) Step of washing red phosphorus particles with at least one or more selected from acids and alkalis.

(C2) Step of coating the surface of red phosphorus particles with an inorganic substance formed of metal hydroxide or oxide by adding a water-soluble metallic salt and an alkaline agent to a slurry having the washed red phosphorus particles dispersed into water.

(C3) Step of washing the red phosphorus particles coated with the inorganic substance with pure water.

(C4) Step of obtaining the flame-retardant stabilized red phosphorus by adding a synthetic material of a thermosetting resin or its prepolymer to a slurry having the washed red phosphorus particles coated with the inorganic substance dispersed into water, performing a polymerization reaction to coat the surface of red phosphorus particles, which is coated with the inorganic substance, with the thermosetting resin.

(C5) Step of washing the flame-retardant stabilized red phosphorus with pure water so that a slurry having the flame-retardant stabilized red phosphorus dispersed in 10% by weight into water at 20° C. has an electric conductivity of 30 µs/cm or below.

(C6) Step of mixing the washed flame-retardant stabilized red phosphorus and the anhydrous zinc compound to obtain the red phosphorus base flame-retardant composition (3) for an epoxy resin.

The epoxy resin composition for a semiconductor sealing material of the third aspect of the invention contains the aforesaid red phosphorus base flame-retardant composition (3) for an epoxy resin.

The masterbatch for an epoxy resin composition for a semiconductor sealing material of the third aspect of the invention contains the aforesaid red phosphorus base flame retardant for an epoxy resin.

The semiconductor sealing material of the third aspect of the invention uses the aforesaid epoxy resin composition for a semiconductor sealing material.

The semiconductor device of the third aspect of the invention uses the aforesaid semiconductor sealing material.

The features of the invention will be described below.

The red phosphorus base flame retardant (1) for an epoxy resin of the first aspect of the invention comprises the coated red phosphorus which has the surface of red phosphorus particles coated with the thermosetting resin containing the anhydrous zinc compound. In the step of producing the coated red phosphorus, the step of washing the red phosphorus particles with at least one selected from acids and alkalis is performed to remove yellow phosphorus and metal contents such as Fe, Ni and Cu which are contained in the red phosphorus particles and become an oxidation catalyst for red phosphorus. Then, the red phosphorus particles are coated with the thermosetting resin containing the anhydrous zinc compound and washed to remove ionic impurities, so that the slurry having the red phosphorus particles dispersed in 10% by weight into water at 20° C. can have an electric conductivity of 30 µs/cm or below.

Under the heating conditions, by a synergistic effect of the low electric conductivity as a result of the removal of ionic impurities, the coating with the thermosetting resin and the formation of the insoluble phosphate compound by the effective reaction of the anhydrous zinc compound and oxo acid of phosphorus, the electric conductivity after being left standing at 80° C. for 20 hours is 150 µs/cm or below, and when 80 ml of water is added to 8 g of the coated red phosphorus and heated at 80 for 20 hours a concentration of $PO_4$ ions eluted is 10 ppm or below, and sufficient flame retardancy, humidity resistance and electric reliability can be obtained for storage at normal temperature and at a temperature for blending into the epoxy resin.

Besides, the red phosphorus base flame retardant (1) for an epoxy resin has heat stability, and the aforesaid electric conductivity of 2000 µs/cm or below and the eluted $PO_4$ ion concentration of 800 ppm or below under the heating condition of a high temperature of 150° C. Thus, the effect of the anhydrous zinc compound is sufficiently recognized, and flame retardancy, humidity resistance and electric reliability can be obtained under a high temperature condition.

The red phosphorous base flame retardant (2) for an epoxy resin of the second aspect of the invention comprises double-coated red phosphorus which has the surface of red phosphorus particles coated with an inorganic substance and further coated with a thermosetting resin containing an anhydrous zinc compound. In the step of producing the double-coated red phosphorus, the step of washing the red phosphorus particles with acid and/or alkali and the step of washing the inorganic substance-coated red phosphorus particles with pure water are performed to remove yellow phosphorus and metal contents such as Fe, Ni and Cu which are contained in the red phosphorus particles and become oxidation catalysts and to remove the ionic impurities produced in the production step so that they are not taken into the product. Then, the red phosphorus particles are coated with the thermosetting resin containing the anhydrous zinc compound, further washed with pure water to remove the ionic impurities, so that the slurry prepared by dispersing the red phosphorus particles in 10% by weight into water at 20° C. can be made to have a low electric conductivity of 30 µs/cm or below.

Specifically, the double-coated red phosphorus of the red phosphorous base flame retardant (2) for an epoxy resin has the inorganic coat of the inorganic substance which is present between the red phosphorous particle surface and the thermosetting resin coat as compared with the coated red phosphorus of the red phosphorus base flame retardant (1) for an epoxy resin, so that the inorganic substance coat covers red phosphorus to prevent generation and elution of oxo acid of phosphorus under the heating condition, and can lower the electric conductivity and the concentration of $PO_4$ ions eluted after being left standing at 80° C. for 20 hours which are better than in the red phosphorus base flame retardant (1) for an epoxy resin. And, sufficient flame retardancy, humidity resistance and electric reliability can be obtained for storage at normal temperature and at a temperature for blending into the epoxy resin.

Besides, the red phosphorous base flame retardant (2) for an epoxy resin has heat stability, and under the heating condition of a high temperature of 150° C., provides a better effect of lowering the electric conductivity and the concentration of $PO_4$ ions eluted than the red phosphorus base flame retardant (1) for an epoxy resin. Thus, flame retardancy, humidity resistance and electric reliability can be obtained under the condition of a high temperature.

The red phosphorus base flame-retardant composition (3) for an epoxy resin of the third aspect of the invention comprises a red phosphorus mixture containing flame-retardant stabilized red phosphorus and an anhydrous zinc compound. In the step of producing the flame-retardant stabilized red phosphorus, red phosphorus particles washed with at least one selected from acids and alkalis are used as the red phosphorus particles, the process of washing the inorganic substance-coated red phosphorus particles and the resin-coated red phosphorus with pure water is performed to remove the ionic impurities produced during the production step to prevent them from being taken into the product, then the flame-retardant stabilized red phosphorus is mixed with the anhydrous zinc compound to prepare the red phosphorus mixture. Thus, the ionic impurities are removed, and the slurry having the red phosphorus mixture dispersed in 10% by weight into water at 20° C. can be made to have a low electric conductivity of 30 $\mu$s/cm or below.

Specifically, the red phosphorus base flame-retardant composition (3) for an epoxy resin is different from the red phosphorus base flame retardants (1), (2) for an epoxy resin and does not have the anhydrous zinc compound coated together with the thermosetting resin on the surface of red phosphorus particles, but has the anhydrous zinc compound is mixed with the flame-retardant stabilized red phosphorus. Even when the anhydrous zinc compound is mixed to use as the flame retardant for an epoxy resin, the electric conductivity and the concentration of $PO_4$ ions eluted after being left standing at 80° C. for 20 hours can be lowered, and sufficient flame retardancy, humidity resistance and electric reliability can be obtained for storage at normal temperature and at a temperature for blending into the epoxy resin.

Besides, the red phosphorus base flame-retardant composition (3) for an epoxy resin has heat stability and provides an effect of lowering the electric conductivity and the concentration of $PO_4$ ions eluted even under the heating condition of a high temperature of 150° C. Thus, flame retardancy, humidity resistance and electric reliability can be obtained under the high-temperature conditions.

BEST MODE FOR CARRYING OUT THE INVENTION

The invention will be described in detail below.
<Red Phosphorus Base Flame Retardant for an Epoxy Resin>

The red phosphorus base flame retardant for an epoxy resin includes a red phosphorus base flame retardant (1) for an epoxy resin of a first aspect of the invention and a red phosphorus base flame retardant (2) for an epoxy resin of a second aspect of the invention.

The red phosphorus base flame retardant (1) for an epoxy resin of the first aspect of the invention is coated red phosphorus which has the surface of red phosphorus particles coated with a thermosetting resin containing an anhydrous zinc compound, wherein the coated red phosphorus is has properties that its slurry prepared by dispersing in 10% by weight into water at 20° C. has an electric conductivity of 30 $\mu$s/cm or below, the slurry which is left standing at 80° C. for 20 hours has an electric conductivity of 150 $\mu$s/cm or below, and when 80 ml of water is added to 8 g of the coated red phosphorus and heated at 80° C. for 20 hours, a concentration of $PO_4$ ions eluted is 10 ppm or below.

The red phosphorus base flame retardant (2) for an epoxy resin of the second aspect of the invention is double-coated red phosphorus which has the surface of red phosphorus particles coated with an inorganic substance and further coated with a thermosetting resin containing an anhydrous zinc compound, wherein the double-coated red phosphorus has properties that its slurry prepared by dispersing in 10% by weight into water at 20° C. has an electric conductivity of 30 $\mu$s/cm or below, the slurry which is left standing at 80° C. for 20 hours has an electric conductivity of 150 $\mu$s/cm or below, and when 80 ml of water is added to 8 g of the double-coated red phosphorus and heated at 80° C. for 20 hours, a concentration of $PO_4$ ions eluted is 10 ppm or below.

In other words, the red phosphorus base flame retardants (1), (2) for an epoxy resin of the present invention have the surface of red phosphorus particles coated with the thermosetting resin containing the anhydrous zinc compound, and are specifically formed of the following coated red phosphorus respectively.

(1) Coated red phosphorus (hereinafter called the coated red phosphorus (1)) which has the surface of red phosphorus particles in the red phosphorus base flame retardant (1) for an epoxy resin coated with the thermosetting resin containing the anhydrous zinc compound.

(2) Double coated red phosphorus (hereinafter called the double-coated red phosphorus (2)) which has the surface of red phosphorus particles in the red phosphorus base flame retardant (2) for an epoxy resin coated with the inorganic substance and further coated with the thermosetting resin containing the anhydrous zinc compound.

Raw material red phosphorus particles prior to the coating treatment which can be used for the coated red phosphorus (1) and the double-coated red phosphorus (2) are not particularly limited and may be a crushed product or a spherical product. Especially, the red phosphorus particles of the invention desirably have an average particle size of 1 to 50 $\mu$m determined by a laser method. It is because if the average particle size were smaller than 1 $\mu$m, it is technically hard to coat the red phosphorus particles and not practical. On the other hand, if it were larger than 50 $\mu$m, it is not desirable because dispersibility of the coated red phosphorus in the resin becomes poor, and a desirable flame retardant effect tends not to be obtained.

The red phosphorus particles are desired to include 10% by weight or below, and particularly preferably 5% by weight or below, of particles having a particle size of less than 1 $\mu$m.

In the red phosphorus base flame retardant for an epoxy resin of the present invention, the particle size of the red phosphorus base flame retardant is variable depending on the particle size of the red phosphorus particles, so that it is desired that a preferable range of average particle size and maximum particle size is previously selected in a stage that the red phosphorus particles have not been undergone the coating treatment according to the shape of an IC package for which the aforesaid red phosphorus base flame retardant is used.

A relation between the average particle size and the maximum particle size of the red phosphorus base flame retardant will be described in further detail. There are desirable particle size ranges depending on the shapes of IC packages for which the red phosphorus base flame retardant is used. For example, where the red phosphorus base flame retardant is used for a liquid sealing material such as CSP (chip size package) or BGA (ball grid array) or for a thin package called transfer BGA, the presence of particles larger than a gap between the substrate and the IC chip is not preferable, and it is desirable that the average particle size is 1 to 10 µm and the maximum particle size is 20 µm or below which are determined by the laser method.

Meanwhile, where the red phosphorus base flame retardant is used for a relatively thick IC package which is called DIP (Dual inline package) or ZIP (Zig-zag inline package), it is desirable that the average particle size is 10 to 50 µm and the maximum particle size is 150 µm or below which are determined by the laser method.

Where the red phosphorus base flame retardant is used for a thin IC package which is called TSOP (Thin small outline package) or TQFP (Thin quad flat package), it is desirable to use particles having a particle size characteristic between the aforesaid two cases, and it is desired that the average particle size is 5 to 20 µm and the maximum particle size is 45 µm or below which are determined by the laser method. The average particle size and the maximum particle size are preferably prepared by treating red phosphorus particles before the coating treatment, but the average particle size and the maximum particle size may be prepared by ordinary means such as screening after preparing the coated red phosphorus.

The anhydrous zinc compound used for the coated red phosphorus (1) and the double-coated red phosphorus (2) described above is distinguished from a hydrated metallic oxide. Specifically, the hydrated metallic compound is a compound containing water of crystallization expressed by a general formula $M_mO_n \cdot XH_2O$ (M represents a metal, m and n represent an integer of 1 or more determined based on the valence of metal, and X represents contained water of crystallization) or a double salt containing the aforesaid compound, but the anhydrous zinc compound used in the present invention is a zinc compound not having water of crystallization. The zinc compound not having such water of crystallization Includes zinc oxide, zinc carbonate, zinc orthosilicate, etc., which are used solely or as a combination of two or more. Among them, zinc oxide is especially preferable in terms of its reactivity with a phosphorus component eluted.

Zinc oxide is expressed by a chemical formula ZnO, zinc carbonate is expressed by a chemical formula $ZnCO_3$, and zinc orthosilicate is expressed by a chemical formula $Zn_2SiO_4$. As to the physical properties of the anhydrous zinc compound, it is desired to be fine in terms of its homogeneous distribution with the coating resin and the reactivity with oxo acid of phosphorus eluted. Generally, it is desired to have an average particle size of 2 µm or below, preferably 0.2 to 1 µm, determined by the laser method. The aforesaid anhydrous zinc compounds are desired not to contain a large amount of ionic impurities.

Under the condition that the red phosphorus base flame retardant for an epoxy resin is used as a sealing material or the like, the anhydrous zinc compounds of the invention react with oxo acid of phosphorus eluted from coated red phosphorus to produce an insoluble phosphate compound so to act to obtain humidity resistance and electric reliability.

The thermosetting resin for coating the red phosphorus particles in the coated red phosphorus (1) and the double-coated red phosphorus (2) is for example one kind or two or more selected from phenol base resins, melamine base resins, epoxy base resins, unsaturated polyester base resins, phenol-formalin base resins, urea-formalin base resins, melamine-formalin base resins, furfuryl alcohol-formalin base resins, etc. Among them, the phenol base resins are particularly desirable because they excel in dispersibility into and compatibility with the epoxy resin.

It is desirable that a content of the thermosetting resin in the coated red phosphorus (1) is 0.5 to 20% by weight, preferably 1 to 10% by weight. And, it is desirable that a content of the thermosetting resin in the double-coated red phosphorus (2) is 0.5 to 20% by weight, preferably 1 to 10% by weight. It is because when the content is less than 0.5% by weight, a resin coating effect cannot be obtained, and the elution of the phosphate component and the production of phosphine gas increase. Meanwhile, when the content becomes larger than 20% by weight, the particles aggregate to increase the particle size, resin dispersibility becomes poor, and the flame-retardant effect also becomes low.

It is desired that the anhydrous zinc compound in the coated red phosphorus (1) or the double-coated red phosphorus (2) is blended in a ratio of 50 to 1000 parts by weight, and preferably 100 to 500 parts by weight, to 100 parts by weight of the thermosetting resin of the aforesaid coated component. It is because a fixing ability of the eluted phosphoric acid component becomes insufficient when the content becomes less than 50 parts by weight, and a strength of the coating resin is also lowered to easily break the coating film, so that when the epoxy resin composition for a semiconductor sealing material is formed, IC circuits are corroded by oxo acid of phosphorus eluted from red phosphorus by the reliability test of the sealing material, and the electric reliability is lowered. Meanwhile, it is not preferable when the aforesaid content is larger than 1000 parts by weight, because a P content in the entire red phosphorus base flame retardant becomes small, and the flame retarding effect becomes low.

The present invention may also contain an anhydrous metallic oxide such as $Al_2O_3$, $ZrO_2$, $TiO_2$ or $SnO_2$ in addition to the anhydrous zinc compound into the thermosetting resin as the coating component.

It is significant in the invention that when the coated red phosphorus (1) or the double-coated red phosphorus (2) is dispersed in 10% by weight into water at 20° C. to prepare a slurry (hereinafter called the 10% slurry), the 10% slurry has an electric conductivity of 30 µs/cm or below. It is not desirable if the electric conductivity becomes larger than 30 µs/cm, because the electric reliability tends to be inferior when the coated red phosphorus (1) or the double-coated red phosphorus (2) is used as the flame retardant for the epoxy resin for a sealing material.

Besides, it is significant in the invention that the coated red phosphorus (1) or the double-coated red phosphorus (2) has a concentration of $PO_4$ ions eluted limited to 10 ppm or below, preferably 8 ppm or below, when 80 ml of water is added to 8 g of its powder and heated at 80° C. for 20 hours.

The reason why the eluted $PO_4$ ion concentration is limited to 10 ppm or below is that it is not preferable if the eluted $PO_4$ ion concentration is larger than 10 ppm because when the coated red phosphorus (1) or the double-coated red phosphorus (2) is used for example as the flame retardant for semiconductor sealing, aluminum wiring formed on the semiconductor device surface is corroded, and the humidity resistant electric reliability of the semiconductor sealing material is impaired.

In the aforesaid conditions, the $PHO_3$ ion concentration is desired to be as low as possible in terms of the humidity resistant electric reliability of the semiconductor sealing material, and it is 300 ppm or below, and preferably 250 ppm or below.

It is also significant that the coated red phosphorus (1) or the double-coated red phosphorus (2) is limited to have an eluted $PO_4$ ion concentration of 800 ppm or below, and preferably 500 ppm or below, when 80 ml of water is added to 8 g of the coated red phosphorus and heated at 150° C. for 20 hours. Then, even under the high-temperature heating condition of 150° C., the eluted $PO_4$ ion concentration can be lowered, so that the humidity resistant electric reliability of the semiconductor sealing material under the high-temperature condition can be obtained.

Under the aforesaid conditions, the $PHO_3$ ion concentration is desired to be as low as possible to 1500 ppm or below in terms of the humidity resistant electric reliability of the semiconductor sealing material.

Besides, it is significant for the coated red phosphorus (1) or the double-coated red phosphorus (2) in the invention that when 8 g of the coated red phosphorus is added to 80 ml of water at 20° C. (10% slurry) and left standing at 80° C. for 20 hours, an electric conductivity is 150 $\mu$s/cm or below, preferably 100 $\mu$s/cm or below. It is not preferable if the electric conductivity is larger than 150 $\mu$s/cm, because when the coated red phosphorus (1) or the double-coated red phosphorus (2) is used as the flame retardant for semiconductor sealing, aluminum wiring formed on the semiconductor device surface is corroded and the humidity resistant electric reliability of the semiconductor sealing material is degraded in the same way as described above.

The electric conductivity in the present invention has a value resulting from ionic compounds such as chlorine ions, bromine ions, $PO_4^{-3}$, $PHO_3^{-2}$, $NH_4^+$, $SO_4^{2-}$, $Na^+$, $K^+$ and $PH_2O_2^-$.

It is also significant for the coated red phosphorus (1) or the double-coated red phosphorus (2) that its 10% slurry has an electric conductivity of 2000 $\mu$s/cm or below, preferably 800 $\mu$s/cm or below, when it is left standing at 150° C. for 20 hours. Under the high-temperature heating condition of 150° C., the aforesaid concentration of the ionic compounds can be lowered, so that the humidity resistant electric reliability of the semiconductor sealing material under the high-temperature conditions can be obtained.

The coated red phosphorus (1) or the double-coated red phosphorus (2) is desired to have an average particle size of 1 to 50 $\mu$m which is determined by the laser method. It is because it is technically difficult to coat the red phosphorus particles when the average particle size is smaller than 1 $\mu$m as described above and it is not practical. Meanwhile, when the average particle size is larger than 50 $\mu$m, it is not desirable because dispersibility in the resin becomes inferior, and a desirable flame retardant effect tends not be obtained.

It is desirable that the coated red phosphorus (1) or the double-coated red phosphorus (2) is controlled to have the average particle size and the maximum particle size in a desirable range depending on the IC package for which the aforesaid red phosphorus (1) or (2) is used as described above. For example, when the coated red phosphorus(l) or the double-coated red phosphorus (2) is used for a liquid sealing material such as CSP or BGA or a thin type package which called transfer BGA, it is preferred that the average particle size is 1 to 10 $\mu$m and the maximum particle size is 20 $\mu$m or less which are determined by the laser method, and when it is used for a relatively thick type IC package which is called DIP or ZIP, it is preferred that the average particle size is 10 to 50 $\mu$m and the maximum particle size is 150 $\mu$m or less which are determined by the laser method. When it is used for a thin type IC package which is called TSOP or TQFP, it is preferred that the average particle size is 5 to 20 $\mu$m and the maximum particle size is 45 $\mu$m or less which are determined by the laser method.

It is particularly desirable that the coated red phosphorus (1) or the double-coated red phosphorus (2) has 10% by weight or below, preferably 5% by weight or below, of particles having a particle size of less than 1 $\mu$m.

And, it is desired that the coated red phosphorus (1) or the double-coated red phosphorus (2) has a red phosphorus content of 65 to 97% byweight after the coating treatment. It is because when the red phosphorus content is less than 65% by weight, the coating component increases and the red phosphorus particles aggregate due to a binder effect, so that the particle size increases to lower the dispersibility in the sealing resin, and the flame retardant effect also tends to lower. Meanwhile, when the red phosphorus content is larger than 97% by weight, it is not desirable because the coating component becomes small, so that a large amount of the phosphoric acid component elutes and phosphine gas is generated.

The red phosphorus base flame retardant (1) for an epoxy resin of the invention can be produced by the production method having the following steps (A1) to (A3).

(A1) Step of washing the red phosphorus particles with at least one selected from acids and alkalis.

(A2) Step of obtaining the coated red phosphorus (1) by adding an anhydrous zinc compound and a synthetic material of a thermosetting resin or its prepolymer to a slurry having the washed red phosphorus particles dispersed into water, and performing a polymerization reaction to coat the surface of red phosphorus particles with the thermosetting resin containing the anhydrous zinc compound.

(A3) Step of obtaining the red phosphorus base flame retardant (1) for an epoxy resin by washing the coated red phosphorus (1) with pure water so that the slurry having the coated red phosphorus (1) dispersed in 10% by weight into water at 20° C. has an electric conductivity of 30 $\mu$s/cm or below.

For example, the aforesaid red phosphorus particles are washed by at least one kind selected from acids and alkalis, namely by an acid and/or an alkali and dispersed into water to prepare a slurry of red phosphorus particles. By washing the red phosphorus particles, a pH value of the slurry is adjusted to 2 or below, preferably 1.5 or below, by an acid such as nitric acid, and metallic contents such as iron, nickel or copper which becomes an oxidation catalyst of red phosphorus and yellow phosphorus which is chemically instable, flammable and one of causes to elute phosphoric acid ions are removed. Before the washing by the above acid, an alkali such as sodium hydroxide may be added to the red phosphorus particle slurry to adjust the pH of the slurry to 9 or more, preferably 10 or more, so to remove most of a yellow phosphorus content previously, and then the aforesaid acid treatment may be performed to remove the metallic contents such as iron, nickel and copper and a yellow phosphorus content. It is desirable that the alkali treatment is performed in the presence of an oxidizer such as hydrogen peroxide while oxidizing phosphine gas.

It is desired that the red phosphorus particles washed with an acid and/or an alkali as described above are further washed with pure water to adjust the pH value of the red phosphorus particle slurry to 2 or more, preferably 2.5 or more, so that the elution of the phosphoric acid ions from the washed red phosphorus particles can be reduced.

Then, the anhydrous zinc compound and the synthetic material of the thermosetting resin or its prepolymer can be added to the red phosphorus slurry to perform a polymerization reaction under the polymerization condition of the thermosetting resin monomer to coat the surface of red phosphorus particles to obtain the coated red phosphorus (1). For example, where a phenol base resin is used as the coating resin, 5 to 30 parts by weight, preferably 10 to 20 parts by weight, of red phosphorus particles are dispersed into 100 parts by weight of water to prepare the red phosphorus slurry. Then, to the red phosphorus slurry, an alkali catalyst such as ammonia or sodium hydroxide or an acid catalyst such as hydrochloric acid, nitric acid or sulfuric acid is added. Then, 0.25 to 20 parts by weight, preferably 0.5 to 10 parts by weight, of the aforesaid anhydrous zinc compound powder and 0.25 to 3 parts by weight, preferably 0.5 to 2 parts by weight, of a phenol resin (as a solid content) are added, and the polymerization reaction is performed at 60 to 90° C. for one to three hours while stirring.

To uniformly disperse the fine anhydrous zinc compound into the red phosphorus particle slurry, a dispersion treatment may be performed by addition of a desired dispersant such as alkali hexametaphosphate or a surface active agent or by a powerful shearing decentralization processing by means of a colloid mill, a homogenizer or supersonic waves as required.

After completing the reaction, filtering, washing with water and drying are performed to provide the product. In the present invention, it is desired that the washing with water is fully performed so that the electric conductivity becomes 30 μs/cm or below, preferably 20 μs/cm or below, when there is prepared a 10% slurry of the coated red phosphorus (1). If the electric conductivity is larger than 30 μs/cm, it is not desirable because when the product is used as the flame retardant for the epoxy resin for the sealing material, the electric reliability tends to become poor as described above.

The red phosphorus base flame retardant (2) for an epoxy resin of the present invention can be produced by the production method having the following steps (B1) to (B5).
(B1) Step of washing red phosphorus particles with at least one or more selected from acids and alkalis.
(B2) Step of coating the surface of red phosphorus particles with an inorganic substance formed of metal hydroxide or oxide by adding a water-soluble metallic salt and an alkaline agent to a slurry having the washed red phosphorus particles dispersed into water.
(B3) Step of washing the red phosphorus particles, which are coated with the inorganic substance, with pure water.
(B4) Step of obtaining double-coated red phosphorus (2) by adding an anhydrous zinc compound and a synthetic material of a thermosetting resin or its prepolymer to a slurry having the washed red phosphorus particles and coated with the inorganic substance dispersed into water, and performing a polymerization reaction to coat the surface of red phosphorus particles, which is coated with the inorganic substance, with the thermosetting resin containing the anhydrous zinc compound.
(B5) Step of obtaining the red phosphorus base flame retardant (2) for an epoxy resin by washing the double-coated red phosphorus (2) with pure water so that a slurry having the double-coated red phosphorus dispersed in 10% by weight into water at 20° C. has an electric conductivity of 30 μs/cm or below.

The production method of the double-coated red phosphorus (2) is the same as that of the coated red phosphorus (1) except that it has the step (B2) of coating the surface of red phosphorus particles with the inorganic substance formed of metallic hydroxide or oxide and the step (B3) of washing the red phosphorus particles coated with the inorganic substance with pure water.

In the production method of the double-coated red phosphorus (2), the inorganic substance for coating the red phosphorus particles in the step (B2) is a metallic hydroxide or oxide of at least one selected from for example Zn, Al, Mg, Si, Co, Zr, Ti and Sn, and the red phosphorus particles are desirably coated with metallic hydroxide or oxide of Al, Al—Co, Al—Ti or Al—Zr.

An amount of the inorganic substance used to coat the red phosphorus particles is 0.5 to 20 parts by weight, preferably 2 to 10 parts by weight, to 100 parts by weight of red phosphorus. It is not desirable if the amount of the inorganic substance is less than 0.5 parts by weight, because phosphine is produced in a large amount, the eluted phosphoric acid amount also increases, and the coating effect becomes poor. And if the amount is larger than 20 parts by weight, the flame retardant performance lowers as the P content is reduced, and when hydroxide is coated, the eluted phosphoric acid amount is increased due to the reaction of water content with P.

The double-coated red phosphorus (2) which is specially obtained by the following method is desirable in terms of electric reliability as the red phosphorus base flame retardant for an epoxy resin composition for a semiconductor sealing material.

Specifically, the aforesaid red phosphorus particles are washed with an acid and/or an alkali, and the red phosphorus particles are dispersed into water to prepare a red phosphorus slurry. The red phosphorus particles are washed by the same way as described above (Step B1). A water-soluble metallic salt is added to the slurry prepared by dispersing the red phosphorus particles into water, an alkaline agent is added to deposit as metallic hydroxide or oxide on the surface of red phosphorus particles to prepare red phosphorus coated with an inorganic substance (Step B2). Then, washing is performed so that a 10% slurry of the obtained red phosphorus coated with the inorganic substance has an electric conductivity of 1000 μs/cm or below (Step B3). The anhydrous zinc compound and the synthetic material of the thermosetting resin or its prepolymer are added to the slurry having the red phosphorus, which is coated with the inorganic substance and washed, dispersed into water, and the polymerization reaction is performed under the polymerization condition of the thermosetting resin monomer to coat the surface of red phosphorus particles, which is coated with the inorganic substance, with the thermosetting resin containing the anhydrous zinc compound, thereby preparing the double-coated red phosphorus (2) (Step B4). Then, washing is performed so that a 10% slurry of the obtained double-coated red phosphorus (2) has an electric conductivity of 30 μs/cm or below (Step B5). Thus, the double-coated red phosphorus (2) can be produced by sequentially performing the above steps.

More specifically, in step B2, 5 to 30 parts by weight, preferably 10 to 20 parts by weight, of red phosphorus particles are dispersed into 100 parts by weight of water to prepare the red phosphorus slurry, then, 0.05 to 3 parts by weight, preferably 0.2 to 2 parts by weight, of a water-soluble metallic salt of at least one selected from Si, Al, Mg, Ti, Zn, Sn, Co and Zr are added to the red phosphorus slurry, at least one alkali selected from inorganic alkali agents such as ammonia gas, aqueous ammonia, caustic soda, caustic potash, $NaHCO_3$, $Na_2CO_3$, $K_2CO_3$, $KHCO_3$ and $Ca(OH)_2$, or organic alkali agents such as ethanolamine is added to adjust the pH of the slurry to 6 to 10, so to deposit the metallic salt on the surface of red phosphorus particles.

In the above production method, aluminum hydroxide can be coated on the red phosphorus particles by simply neutralizing poly-aluminum chloride or aluminum sulfate with an alkali.

After completing the step B2, the red phosphorus coated with the inorganic substance is filtered so to be separated from the reaction solution and washed by the next step B3.

The step B3 is a step to wash the red phosphorus coated with the inorganic substance obtained in the step B2, so that the electric conductivity of the 10% slurry of the red phosphorus coated with the inorganic substance becomes 1000 µs/cm or below, preferably 500 µs/cm or below.

The reasons of adjusting the electric conductivity of the washed red phosphorus coated with the inorganic substance to the aforesaid ranges in the step B3 include that if the electric conductivity exceeds 1000 µs/cm, it becomes difficult to adjust the electric conductivity of the target double-coated red phosphorus (2) to 30 µm/cm or below by washing in the step B5, a large amount of ionic impurities are taken into the coating resin at the polymerization reaction in the step B4 and it is difficult to remove the ionic impurities from the coating resin by the washing treatment in the step B5. And, the electric conductivity is forcedly lowered when the washing is performed in the step B5 only without washing in the step B3, so that repetition of excessive washing breaks the coated film on the surface of red phosphorus particles, and an eluted amount of oxo acid of phosphorus is rather increased. Especially, when used as a flame retardant for the epoxy resin composition of a sealing material which is required to have the electric reliability, it is not desirable because the ionic impurities taken into the resin and the elution of oxo acid of phosphorus degrade the electric reliability.

The method of washing red phosphorus in the step B3 is not particularly limited, but it is desirable to wash by means of repulping or the like.

In the step B4, the anhydrous zinc compound and the synthetic raw material of the thermosetting resin or its prepolymer are added to the slurry of the red phosphorus coated with the inorganic substance in the step B3, and the thermosetting resin containing the anhydrous zinc compound is coated on the surface of the red phosphorus particles coated with the inorganic substance by the polymerization reaction performed under the polymerization condition of the thermosetting resin monomer. For example, where a phenol base resin is used as the coating resin, the polymerization reaction may be effected by dispersing 5 to 30 parts by weight, preferably 10 to 20 parts by weight, of the red phosphorus washed and coated with the inorganic substance in the step B3 into 100 parts by weight of water to prepare a red phosphorus slurry, adding an alkali catalyst such as ammonia or sodium hydroxide or an acid catalyst such as hydrochloric acid, nitric acid or sulfuric acid to the red phosphorus slurry, then adding 0.25 to 20 parts by weight, preferably 0.5 to 10 parts by weight, of powder of the anhydrous zinc compound and 0.25 to 3 parts by weight, preferably 0.5 to 2 parts by weight, of a phenol resin (as a solid content), and stirring at 60 to 90° C. for one to three hours.

To uniformly disperse the fine anhydrous zinc compound into the slurry of the red phosphorus coated with the inorganic substance, a desired dispersing agent such as alkali hexametaphosphate or a surface active agent may be added or a dispersing treatment may be performed by a heavy-duty shear dispersion treatment by means of a colloid mill, a homogenizer or supersonic waves or the like if necessary.

After completing the reaction, the double-coated red phosphorus (2), which has the surface of red phosphorus particles coated with the inorganic substance further coated with the thermosetting resin containing the anhydrous zinc compound, is separated from the reaction liquid, and then washed by the step B5.

The step B5 is a step to wash the aforesaid double-coated red phosphorus (2) obtained, so that a 10% slurry of the double-coated red phosphorus (2) has an electric conductivity of 30 µs/cm or below, preferably 20 µs/cm or below.

The reason of adjusting the electric conductivity of the washed red phosphorus to the aforesaid ranges in the step B5 is that it is not desirable when the electric conductivity is larger than 30 µs/cm because the electric conductivity tends to be poor when the double-coated red phosphorus (2) is used as the flame retardant for the epoxy resin for the sealing material as described above.

In the aforesaid step B5, the method of washing the double-coated red phosphorus is not particularly limited, but it is especially desirable to wash by means of repulping or the like.

After completing the washing, the double-coated red phosphorus (2) is fully dried in an atmosphere of inert gas such as nitrogen gas at 60 to 160° C. for 1 to 24 hours so that the product is obtained with a water content thoroughly removed.

In the invention, the coated red phosphorus (1) or the double-coated red phosphorus (2) can be used as a mixture powder with metallic oxide, metallic hydroxide, metallic carbonate, metallic phosphate or an inorganic ion exchanger which reacts with a phosphoric acid component to fix as insoluble or hardly-soluble phosphate.

The aforesaid metallic oxide, metallic hydroxide, metallic carbonate or metallic phosphate is one or two or more of oxides, hydroxides, carbonates or orthophosphates selected from Zn, Mg, Ti, Ca, Al, Co, Zr and Sn for example. Specifically, they are zinc carbonate, zinc hydroxide, zinc orthosilicate, magnesium oxide, magnesium hydroxide, titanium oxide, calcium oxide, calcium hydroxide, calcium carbonate, calcium phosphate, calcium tertiary phosphate, hydroxyapatite, calcium silicate, aluminum oxide, aluminum hydroxide, cobalt oxide, cobalt hydroxide, zirconium oxide, zirconium hydroxide, tin oxide and tin hydroxide, and they are used solely or as a combination of two or more. They may be a hydrate or an anhydride. If they are a hydrate and blended with an epoxy resin for molding, water is produced at a molding temperature, and the produced water reacts with the red phosphorus to generate phosphine. Thus, there is a tendency to cause a drawback. Therefore, they are desired to be an anhydride.

Examples of the inorganic ion exchanger can be inorganic anion exchangers such as a hydrocalmite based inorganic anion exchanger, a hydrotalcite based inorganic anion exchanger, $BiO_x(OH)_y(NO_3)_Z$(X=0.9 to 1.1, Y=0.6 to 0.8, Z=0.2 to 0.4), $Mg_{4.3}Al_2(OH)_{12.6}CO_3.3.5H_2O$, $Sb_2O_5.2H_2O$, $SbSi_yBi_wO_x(OH)_y(NO_3)_x.nH_2O$(V=0.1 to 0.3, w=1.5 to 1.9, X=4.1 to 4.5, Y=1.2 to 1.6, Z=0.2 to 0.3, n=1 to 2), etc.

And, the metallic oxide, metallic hydroxide, metallic carbonate, metallic phosphate or inorganic ion exchanger is desired to be fine in view of homogeneous dispersibility with the aforesaid coated red phosphorus and the reactivity with the eluted oxo acid of phosphorus, and the average particle size is generally 10 µm or below, and preferably 0.2 to 5 µm. The aforesaid oxide or hydroxide selected from Zn, Mg, Ti, Ca, Al, Co, Zr and Sn is desirably not surface-treated than surface-treated in terms of reactivity with phosphoric ions so that it becomes a component reacting with the eluted phosphoric ion element.

An amount of such metallic oxide, metallic hydroxide, metallic carbonate, metallic phosphate or inorganic ion exchanger to the coated red phosphorus is desirably 0.1 to 20 parts by weight to 100 parts by weight of the coated red phosphorus.

Where the mixture powder of the coated red phosphorus (1) or the double-coated red phosphorus (2) and the metallic oxide, metallic hydroxide, metallic carbonate, metallic phosphate or inorganic ion exchanger is prepared, it is desired to adjust an electrical conductivity of the mixture power in addition to that of the coated red phosphorus alone. And, it is desired that the concentration of $PO_4$ ions eluted when 80 ml of water is added to 8 g of the mixture powder and heated at 80° C. for 20 hours is 10 ppm or below, preferably 8 ppm or below, and the electric conductivity after being left at 80° C. for20 hours is150 $\mu$s/cm or below, preferably 10 to 100 $\mu$s/cm. The reason of limiting the eluted $PO_4$ ion concentration to 10 ppm or below is that it is not preferable when the eluted $PO_4$ ion concentration is larger than 10 ppm as described above because when the mixture powder is used as a flame retardant for semiconductor sealing for example, aluminum wiring formed on the semiconductor device surface is corroded and the humidity resistant electric reliability of the semiconductor sealing material is impaired.

And, the $PHO_3$ ion concentration under the above condition is desired to be as low as possible in terms of the humidity resistant electric reliability of the semiconductor sealing material, and it is 300 ppm or below, preferably 250 ppm or below.

If the electric conductivity becomes larger than 150 $\mu$s/cm, it is not desirable because when the mixture powder is used as the flame retardant for semiconductor sealing, aluminum wiring formed on the semiconductor device surface is corroded in the same way as above and the humidity resistant electric reliability of the semiconductor sealing material is impaired.

<Red Phosphorus Base Flame-retardant Composition for Epoxy Resin>

The red phosphorus base flame-retardant composition (3) for an epoxy resin of the third aspect of the invention is a red phosphorus mixture containing an anhydrous zinc compound and flame-retardant stabilized red phosphorus which has the surface of red phosphorus particles coated with at least one kind selected from thermosetting resins and inorganic substances and has an electric conductivity of 30 $\mu$s/cm or below to a slurry prepared by dispersing the coated red phosphorus particles in 10% by weight into water at 20° C., wherein the red phosphorus mixture has properties that when it is dispersed in 10% by weight into water and a prepared slurry is left standing at 80° C. for 20 hours, its electric conductivity is 150 $\mu$s/cm or below, and when 80 ml of water is added to 8 g of the red phosphorus mixture and heated at 80° C. for 20 hours, a concentration of $PO_4$ ions eluted is 10 ppm or below.

The red phosphorus base flame-retardant composition (3) for an epoxy resin of the invention is flame-retardant stabilized red phosphorus undergone the coating treatment, which is modified so that the flame retardant formed of the flame-retardant stabilized red phosphorus not containing the anhydrous zinc compound within the coating element can be used suitably as the flame retardant for the epoxy resin for semiconductor sealing.

In other words, the red phosphorus base flame-retardant composition (3) for an epoxy resin is different from the red phosphorus base flame retardants (1), (2) for an epoxy resin and does not have the anhydrous zinc compound coated together with the thermosetting resin on the surface of red phosphorus particles but has the anhydrous zinc compound mixed with the flame-retardant stabilized red phosphorus so to use as the red phosphorus mixture.

The type of flame-retardant stabilized red phosphorus which can be used in the invention is desirably modified red phosphorus which has the red phosphorus surface coated with at least one selected from the thermosetting resins and the inorganic substances.

The thermosetting resin used for coating the surface of red phosphorus particles is for example one or two or more selected from phenol base resins, melamine base resins, epoxy base resins, unsaturated polyester base resins, phenol-formalin base resins, urea-formalin base resins, melamine-formalin base resins, furfuryl alcohol-formalin base resins, etc.

As the inorganic substance for coating the surface of red phosphorus particles, at least one of oxide or hydroxide selected from Zn, Al, Mg, Ti, Si, Co, Zr and Sn is used, and the inorganic substance used for coating may be a hydrate or an anhydride.

The flame-retardant stabilized red phosphorus used in the invention is desirably modified red phosphorus which has red phosphorus double-coated with the thermosetting resin and the inorganic substance as described above. Especially, it is desirable that the surface of red phosphorus particles is coated with the inorganic substance and additionally coated with the thermosetting resin. Specifically, it is more desirable that red phosphorus is coated with at least one of the oxide or hydroxide selected from Zn, Al, Mg, Ti, Si, Co, Zr and Sn, and the coated red phosphorus is further coated with the phenol resin, thereby double coating.

A coated amount of the inorganic substance is 0.5 to 20 parts by weight, preferably 2 to 10 parts by weight, to 100 parts by weight of red phosphorus, and a coated amount of the thermosetting resin is 0.5 to 10 parts by weight, preferably 1 to 5 parts by weight, as a solid content to 100 parts by weight of red phosphorus.

The coated flame-retardant stabilized red phosphorus is desired that the red phosphorus particles before the coating treatment contain 10% by weight or below, preferably 5% by weight or below of particles having a particle size of less than 1 $\mu$m are used, and the content of red phosphorus after the coating treatment is 65 to 97% by weight. It is not preferable if the content of red phosphorus is smaller than 65% by weight because the coating component increases, and the red phosphorus particles aggregate by a binder effect, so that the particle size becomes large, dispersibility in the sealing resin lowers, and the flame retardant effect also tends to degrade. Meanwhile, when the content of red phosphorus is larger than 97% by weight, it is not desirable because the coating component is little, the phosphoric acid component elutes in a large amount, and phosphine gas also generates.

In the red phosphorus base flame-retardant composition (3) for an epoxy resin of the invention, it is important that the aforesaid flame-retardant stabilized red phosphorus has a property that its 10% slurry has an electric conductivity of 30 $\mu$s/cm or below, preferably 20 $\mu$s/cm or below. It is not desirable if the electric conductivity is larger than 30 $\mu$s/cm because when the flame-retardant stabilized red phosphorus is used as the flame retardant for the epoxy resin for the sealing material, the electric reliability tends to become inferior.

The red phosphorus base flame-retardant composition (3) for an epoxy resin of the invention, which is particularly produced by the method consisting of the following steps (C1) to (C6), is especially desirable in view of the electric reliability as the red phosphorus base flame-retardant composition of the epoxy resin composition for a semiconductor sealing material.

(C1) Step of washing red phosphorus particles with at least one or more selected from acids and alkalis.

(C2) Step of coating the surface of red phosphorus particles with an inorganic substance formed of metal hydroxide or oxide by adding a water-soluble metallic salt and an alkaline agent to a slurry having the washed red phosphorus particles dispersed into water.

(C3) Step of washing the red phosphorus particles coated with the inorganic substance with pure water so that a 10% R slurry of the washed red phosphorus particles has an electric conductivity of 1000 μs/cm or below.

(C4) Step of obtaining the flame-retardant stabilized red phosphorus by adding a synthetic material of a thermosetting resin or its prepolymer to a slurry having the washed red phosphorus particles coated with the inorganic substance dispersed into water, performing a polymerization reaction to coat the surface of red phosphorus particles, which is coated with the inorganic substance, with the thermosetting resin.

(C5) Step of washing the aforesaid flame-retardant stabilized red phosphorus with pure water so that a slurry having the flame-retardant stabilized red phosphorus dispersed in 10% by weight into water at 20° C. has an electric conductivity of 30 μs/cm or below.

(C6) Step of mixing the washed flame-retardant stabilized red phosphorus and the anhydrous zinc compound to obtain the red phosphorus base flame-retardant composition (3) for an epoxy resin.

More specifically, in the step C1, the red phosphorus particles are washed with an acid and/or an alkali in the same way as above. The step C2 disperses 5 to 30 parts by weight, preferably 10 to 20 parts by weight, of red phosphorus particles into 100 parts by weight of water to prepare a red phosphorus slurry, then adds 0.05 to 3 parts by weight, preferably 0.2 to 2 parts by weight, of a water-soluble metallic salt of at least one selected from for example Si, Al, Mg, Ti, Zn, Sn, Co and Zr to the red phosphorus slurry, adds at least one kind of alkali selected from inorganic alkali agents such as ammonia gas, aqueous ammonia, caustic soda, caustic potash, $NaHCO_3$, $Na_2CO_3$, $K_2CO_3$, $KHCO_3$ and $Ca(OH)_2$ or organic alkali agents such as ethanol amine to adjust the pH value of the slurry to 6 to 10 and deposits the metallic salt on the surface of red phosphorus particles.

In the above production method, aluminum hydroxide can be coated on the red phosphorus particles by simply neutralizing poly-aluminum chloride or aluminum sulfate with an alkali.

After completing the step C2, the obtained red phosphorus coated with the inorganic substance is filtered to separate from the reaction solution, and the next step C3 is performed.

The step C3 washes the red phosphorus coated with the inorganic substance obtained in the step C2, so that the 10% slurry of the red phosphorus coated with the inorganic substance has an electric conductivity of 1000 μs/cm or below, preferably 500 μs/cm or below.

The electric conductivity of the washed red phosphorus coated with the inorganic substance is limited to the aforesaid ranges in the step C3 because if the electric conductivity exceeds 1000 μs/cm, it becomes difficult to adjust the electric conductivity of the target flame-retardant stabilized red phosphorus to 30 μm/cm or below by washing in the step C5 a large amount of ionic impurities are taken into the coating resin at the polymerization reaction in the step C4 and it is difficult to remove the ionic impurities from the coating resin by washing afterward. And, the electric conductivity is forcedly lowered when the washing is performed in the step C5 only without washing in the step C3, so that a repetition of excessive washing breaks the coated film on the surface of red phosphorus particles, and an eluted amount of oxo acid of phosphorus is rather increased. Especially, when the red phosphorus base flame-retardant composition (3) is used as the flame retardant for the epoxy resin composition of the sealing material which is required to have the electric reliability, the ionic impurities taken into the resin and the elution of oxo acid of phosphorus degrade the electric reliability.

The method of washing red phosphorus in the step C3 is not particularly limited, but it is especially desirable to wash by means of filtering, repulping or the like.

In the step C4 the synthetic raw material of the thermosetting resin or its prepolymer is added to the slurry of red phosphorus coated with the inorganic substance in the step C3 and the surface of red phosphorus particles coated with the inorganic substance is further coated with the thermosetting resin by the polymerization reaction performed under the polymerization condition of the thermosetting resin monomer. For example, where a phenol base resin is used as the coating resin, 5 to 30 parts by weight, preferably 10 to 20 parts by weight, of the red phosphorus coated with the inorganic substance washed in the step C3 are dispersed into 100 parts by weight of water to prepare a red phosphorus slurry. Then, the red phosphorus slurry may be polymerization-reacted at 60 to 90° C. for one to three hours while stirring after adding an alkali catalyst such as ammonia or sodium hydroxide or an acid catalyst such as hydrochloric acid, nitric acid or sulfuric acid and adding 0.25 to 10 parts by weight, preferably 0.5 to 5 parts by weight, of a phenol resin (as a solid content). After completing the reaction, the flame-retardant stabilized red phosphorus, which has the surface of red phosphorus particles coated with the inorganic substance further coated with the thermosetting resin, is separated from the reaction liquid, and then washed in the next step C5.

The step C5 is a step to wash the aforesaid flame-retardant stabilized red phosphorus obtained so that a 10% slurry of the flame-retardant stabilized red phosphorus has an electric conductivity of 30 μs/cm or below, preferably 20 μs/cm or below.

The reason of adjusting the electric conductivity of the washed red phosphorus to the aforesaid ranges in the step C5 is that it is not preferable if the electric conductivity is larger than 30 μs/cm because the electric conductivity tends to become poor when it is used as the flame retardant for the epoxy resin for the sealing material as described above.

In the step C5 the method of washing the flame-retardant stabilized red phosphorus is not particularly limited, but it is especially desirable to wash by means of repulping or the like.

After completing the washing, the flame-retardant stabilized red phosphorus is obtained by fully drying in the atmosphere of inert gas such as nitrogen gas at 60 to 160° C. for 1 to 24 hours so that water content is thoroughly removed.

Then, the washed flame-retardant stabilized red phosphorus and the anhydrous zinc compound are mixed to obtain the red phosphorus base flame-retardant composition (3) for an epoxy resin.

The flame-retardant stabilized red phosphorus is desirably controlled to have the average particle size and the maximum particle size in a suitable range depending on the shape of an IC package for which the flame-retardant stabilized red phosphorus is used as described above. For example, when the flame-retardant stabilized red phosphorus is used for a liquid sealing material such as CSP or BGA or a thin type package which is called transfer BGA, it is preferred that the average particle size is 1 to 10 μm and the maximum particle size is 20 μm or below which are determined by the laser method, and when it is used for a relatively thick type IC package which is called DIP or ZIP, the average particle size is 10 to 50 μm and the maximum particle size is 150 μm or below which are determined by the laser method. When it is used for a thin type IC package which is called TSOP or TQFP, it is preferred that the average particle size is 5 to 20 μm and the maximum particle size is 45 μm or below which are determined by the laser method.

It is also desirable that the flame-retardant stabilized red phosphorus has 10% by weight or below, preferably 5% by weight or below, of particles having a particle size of less than 1 μm.

The anhydrous zinc compound which is another component of the red phosphorus base flame-retardant composition (3) for an epoxy resin of the invention is a component which reacts with oxo acid of phosphorus eluted from the red phosphorus base flame-retardant composition (3) for an epoxy resin to fix such acid as a hardly-soluble or insoluble phosphate compound. The anhydrous zinc compound is distinguished from a hydrated metallic compound. Specifically, the hydrated metallic compound is a compound containing water of crystallization expressed by a general formula $M_mO_n \cdot XH_2O$ (M represents a metal, m and n represent an integer of 1 or more determined based on a valence of the metal, and X represents water of crystallization contained) or a double salt containing the above compound. The anhydrous zinc compound used in the invention is a zinc compound not having water of crystallization. The zinc compound not having such water of crystallization includes zinc oxide, zinc carbonate and zinc orthosilicate, and they are used solely or in a combination of two or more. Among them, zinc oxide is particularly desirable in terms of its reactivity with the phosphorus content eluted in the invention.

Zinc oxide is expressed by a general formula ZnO, zinc carbonate is expressed by a general formula $ZnCO_3$, and zinc orthosilicate is expressed by a general formula $Zn_2SiO_4$. The anhydrous zinc compound desirably has physical properties that it is fine powder in terms of its uniform dispersibility with the flame-retardant stabilized red phosphorus and reactivity with oxo acid of phosphorus eluted, and it is desired to have an average particle size of 10 μm or below, preferably 0.2 to 5 μm, which are determined by the laser method. The anhydrous zinc compound is desired not to contain a large amount of ionic impurities.

The aforesaid anhydrous zinc compound is generally mixed in 1 to 20 parts by weight, preferably 5 to 20 parts by weight, to 100 parts by weight of the flame-retardant stabilized red phosphorus. It is not preferable if the anhydrous zinc compound is less than 1 part by weight because a trapping effect for the eluted phosphoric acid component becomes insufficient, and if it is larger than 20 parts by weight, an eluted amount of zinc ions from the zinc compound increases, and an electric characteristic is degraded.

The red phosphorus base flame-retardant composition (3) for an epoxy resin of the invention is used in the form of mixture powder in which the anhydrous zinc compound is mixed in the aforesaid ratio with the flame-retardant stabilized red phosphorus and uniformly dispersed into it. For example, the flame-retardant stabilized red phosphorus and the anhydrous zinc oxide powder are put in and mixed by a conic type mixer such as a Nauta mixer or a Ribocorn in an atmosphere of nitrogen to prepare a powder red phosphorus mixture in which the flame-retardant stabilized red phosphorus and the anhydrous zinc compound are dispersed uniformly, although not specifically limited.

Thus, the red phosphorus mixture having the anhydrous zinc compound uniformly dispersed into the flame-retardant stabilized red phosphorus can be obtained. It is also desirable that when 80 ml of water is added to 8 g of the aforesaid red phosphorus mixture and heated at 80° C. for 20 hours, a concentration of the eluted $PO_4$ ions is 10 ppm or below, preferably 8 ppm or below. Besides, after a 10% slurry of the red phosphorus mixture is left standing at 80° C. for 20 hours, it is desirable that the electric conductivity is 150 μs/cm or below, preferably 100 μs/cm or below.

The reason that the eluted $PO_4$ ion concentration is limited to 10 ppm or below is that it is not preferable if the eluted $PO_4$ ion concentration is larger than 10 ppm as described above, because when the red phosphorus mixture is used for example as the flame retardant for semiconductor sealing, aluminum wiring formed on the semiconductor device surface is corroded, and the humidity resistant electric reliability of the semiconductor sealing material is degraded.

In the aforesaid conditions, the $PHO_3$ ion concentration is desired to be as low as possible to 200 ppm or below, preferably 100 ppm or below in terms of the humidity resistant electric reliability of the semiconductor sealing material.

And, it is not preferable when the electric conductivity is larger than 150 μs/cm and the red phosphorus mixture is used as the flame retardant for semiconductor sealing, because aluminum wiring formed on the surface of a semiconductor device is corroded in the same way as above, and the humidity resistant electric reliability of the semiconductor sealing material is degraded.

It is desired that when the slurry which has the red phosphorus mixture dispersed in 10% by weight into water is left standing at 150° C. for 20 hours, it has an electric conductivity of 2000 μs/cm or below, preferably 1500 μs/cm or below, and when 80 ml of water is added to 8 g of the red phosphorus mixture and heated at 150° C. for 20 minutes, the eluted $PO_4$ ion concentration is 800 ppm or below, preferably 500 ppm or below.

In the invention, the electric conductivity has a value resulting from the ionic compounds such as chlorine ions, bromine ions, $PO_4^{-3}$, $PHO_3^{-2}$, $NH_4^+$, $SO_4^{2-}$, $Na^+$, $K^+$, $PH_2O_2$ ions.

Besides, the red phosphorus base flame-retardant composition (3) for an epoxy resin of the invention can be used together with another metallic oxide, metallic hydroxide, metallic carbonate, metallic phosphate or an inorganic ion exchanger which reacts with a phosphoric acid component to fix as insoluble or hardly-soluble phosphate.

The aforesaid metallic oxide, metallic hydroxide, metallic carbonate or metallic phosphate is one or two or more of oxides, hydroxides, carbonates or phosphates selected from Zn, Mg, Ti, Ca, Al, Co, Zr and Sn for example. Specifically, they are zinc hydroxide, zinc orthosilicate, magnesium oxide, magnesium hydroxide, titanium oxide, calcium oxide, calcium hydroxide, calcium carbonate, calcium phosphate, calcium tertiary phosphate, hydroxyapatite, calcium silicate, aluminum oxide, aluminum hydroxide, cobalt oxide, cobalt hydroxide, zirconium oxide, zirconium hydroxide, tin oxide and tin hydroxide, and they are used solely or as a combination of two or more. They may be a hydrate or an anhydride. But, the anhydride is preferable because if a hydrate is used and blended with an epoxy resin for molding, there are tendencies of disadvantages that water is produced at a molding temperature and the produced water reacts with the red phosphorus to generate phosphine.

Examples of the inorganic ion exchanger can be inorganic anion exchangers such as a hydrocalmite based inorganic anion exchanger, a hydrotalcite based inorganic anion exchanger, $BiO_x(OH)_y(NO_3)_z$ (X=0.9 to 1.1, Y=0.6 to 0.8, Z=0.2 to 0.4), $Mg_{4.3}Al_2(OH)_{12.6}CO_3.3.5H_2O$, $Sb_2O_5.2H_2O$, $SbSi_vBi_wO_x(OH)_y(NO_3)_z.nH_2O$ (V=0.1 to 0.3, w=1.5 to 1.9, X=4.1 to 4.5, Y=1.2 to 1.6, Z=0.2 to 0.3, n=1 to 2), etc.

The aforesaid metallic oxide, metallic hydroxide, metallic carbonate, metallic phosphate or inorganic ion exchanger is desirably mixed generally in 1 to 20 parts by weight, preferably 5 to 20 parts by weight, to 100 parts by weight of flame-retardant stabilized red phosphorus. It is also desirable to adjust its electric conductivity as mixture powder, and when 80 ml of water is added to 8 g of the mixture powder and heated at 80° C. for 20 hours, the eluted $PO_4$ ion concentration is desirably 10 ppm or below, preferably 8 ppm or below. Besides, it is preferred that the electric conductivity after keeping at 80° C. for 20 hours is 150 $\mu$s/cm or below, preferably 100 $\mu$s/cm or below.

The above described red phosphorus base flame retardants (1), (2) for an epoxy resin or the red phosphorus base flame-retardant composition (3) for an epoxy resin of the present invention is substantially free from the elution of a phosphoric acid component such as oxo acid of phosphorus from red phosphorus, so that it can be used suitably as the flame retardant for an epoxy resin for electric parts such as semiconductor sealing materials, laminated plates, printed circuit boards and flat cables, and particularly suitably used as the flame retardant for the epoxy resin for the semiconductor sealing material.

<Epoxy Resin Composition for Semiconductor Sealing Material>

Then, the epoxy resin composition for a semiconductor sealing material of the invention will be described.

The epoxy resin composition for a semiconductor sealing material of the invention contains the aforesaid red phosphorus base flame retardant (1) or (2) for an epoxy resin or the red phosphorus base flame-retardant composition (3) for an epoxy resin.

Especially, the epoxy resin composition for a semiconductor sealing material of the invention contains the aforesaid red phosphorus base flame retardant (1) or (2) for an epoxy resin or the red phosphorus base flame-retardant composition (3) for an epoxy resin, and an epoxy resin, a curing agent, a curing accelerator and an inorganic filler.

The red phosphorus base flame retardant (1) or (2) for an epoxy resin or the red phosphorus base flame-retardant composition (3) for an epoxy resin is mixed in a ratio of 0.05 to 5% by weight, preferably 0.5 to 2% by weight, to the epoxy resin composition for a semiconductor sealing material. It is not preferable if the amount is less than 0.05% by weight because a sufficient flame retardant effect cannot be obtained and if it is larger than 5% by weight, burning of the resin tends to be promoted because of high burning energy possessed by red phosphorus.

As the epoxy resin used for the semiconductor sealing material, there are monomers, oligomers and polymers in general which have at least two epoxy groups in one molecule. Their examples are phenol novolac type epoxy resins and orthocresol novolac type epoxy resins which are obtained by epoxidizing novolac resins which can be obtained by condensing or cocondensing in the presence of an acid catalyst phenols such as phenol, cresol, xylenol, resorcin, catechol, bisphenol A and bisphenol F and/or naphthols such as α-naphthol, β-naphthol and dihydroxynaphthalene, and aldehydes such as formaldehyde, acetaldehyde, propionaldehyde, benzaldehyde and salicylaldehyde; those obtained by epoxidizing addition products or polyaddition products with bisphenol A, bisphenol B. bisphenol F. bisphenol S, diglycidyl ether such as alkyl-substituted or non-substituted biphenol, phenols and dicyclopentadiene or terpenes; glycidyl ester type epoxy resins obtained by a reaction between polybasic acid such as phthalic acid or dimer acid and epichlorohydrin; glycidylamine type epoxy resins obtained by a reaction between polyamine such as diaminodiphenylmethane or isocyanutic acid and epichlorohydrin; linear aliphatic epoxy resins obtained by oxidizing olefin bonding with peracid such as peracetic acid; and cycloaliphatic epoxy resin, although not specifically limited. They can be used alone or in a combination of two or more.

The aforesaid epoxy resin is used in 5 to 25% by weight, preferably 6 to 18% by weight, to the epoxy resin composition for a semiconductor sealing material.

As the curing agent, those known by one skilled in the art can be used. Particularly, their examples are $C_2$ to $C_{20}$ straight chain aliphatic diamines such as ethylenediamine, trimethylenediamine, tetramethylenediamine and hexamethylenediamine; amines such as metaphenylenediamine, paraphenylenediamine, paraxylenediamine, 4,4'-diaminodiphenylmethane, 4,4'-diaminodiphenylpropane, 4,4'-diaminodiphenylether, 4,4'-diaminodiphenylsulfone, 4,4'-diaminodicyclohexane, bis(4-aminophenyl)phenylmethane, 1,5-diaminonaphthalene, methaxylylenediamine, paraxylylenediamine, 1,1-bis(4-aminophenyl)cyclohexane and dicyanodiamide; novolac type phenol resins such as phenol novolac resins, cresol novolac resins, tert-butylphenol novolac resins and nonylphenol novolac resins; resol type phenol resins; polyoxystyrenes such as polyparaoxystyrenes; phenol resins such as phenol aralkyl resins and naphthol aralkyl resins obtained by copolycondensation of carbonyl compounds and phenolic compounds, in which hydrogen atoms bonded to aromatic rings such as a benzene ring or naphthalene ring are substituted by hydroxyl groups; and acid anhydrides, but it is desirable to use a phenol type curing agent because a rate of moisture absorption lowers.

The above curing agent is added in an equivalence ratio of 0.1 to 10, preferably 0.7 to 1.3, to the epoxy resin.

As the inorganic filler, there are fused silica powder, crystalline silica powder, alumina (filler), silicon nitride, aluminum nitride, boron nitride, magnesia, titanium oxide, calcium carbonate, magnesium carbonate, talc, calcium silicate, etc., and they are used alone or in a combination of two or more.

The inorganic filler is desirably added in 40 to 95% by weight in the epoxy resin composition for a semiconductor sealing material.

And, a curing accelerator can be added if necessary. The curing accelerator includes for example tertiary amine compounds such as 1,8-diaza-bicyclo(5,4,0)undecene-7, triethylenediamine and benzyldimethylamine; imidazole compounds such as 2-methylimidazole, 2-ethyl-4-methylimidazole, 2-phenylimidazole and 2-phenyl-4-methylimidazole; organic phosphine compounds such as triphenylphosphine and tributylphosphine; phosphonium salts; and ammonium salts, and they are used alone or in a combination of two or more.

If necessary, other flame retardants, silan-coupling agents, release agents, coloring agents, low-stress additives, surface active agents, etc. can be contained.

Other flame retardants which can be used together with the aforesaid red phosphorus base flame retardant (1) or (2) for an epoxy resin or the red phosphorus base flame-retardant composition (3) for an epoxy resin include a hydrated metallic compound, a nitrogen-containing base flame retardant, a phosphorus base flame retardant, etc.

The hydrated metallic compound includes a compound expressed by $M_mO_n \cdot xH_2O$ (M represents a metal, m and n represent an integer of 1 or more determined based on the metal valence, and x represents contained water of crystallization) or double salts containing the above compound. Specifically, aluminum hydroxide, magnesium hydroxide, basic magnesium carbonate, calcium hydroxide, barium hydroxide, zirconium hydroxide, dawsonite, zinc stannate, zinc borate, aluminum borate, basic zinc carbonate, borax, zinc molybdate, zinc phosphate, magnesiumphosphate, hydrotalcite, hydrocalmite, kaolin, talc, sericite, pyrophyllite, bentonite, kaolinite, calcium sulfate, zinc sulfate, etc. are listed.

The nitrogen-containing base flame retardant includes melamine derivatives such as melamine, melamine cyanurate, methylolmeramine, (iso)cyanuric acid, melam, melem, mellon, succinoguanamine, melamine sulfate, acetoguanamine sulfate, melam sulfate, guanylmelamine sulfate, melamine resin, BT resin, cyanuric acid, isocyanuric acid, isocyanuric acid derivative, melamine isocyanurate, benzoguanamine and acetoguanamine, and guanidine base compounds.

The phosphorus base flame retardant includes for example triethyl phosphate, tricresyl phosphate, triphenyl phosphate, cresylphenyl phosphate, octyldiphenyl phosphate, diethylenephosphoric acid ethyl ester, dihydroxypropylene-phosphoric acid butyl ester, ethylenephosphoric acid disodium ester, methylphosphonate, dimethyl methylphosphonate, diethyl methylphosphonate, ethyl phosphonate, propyl phosphonate, butyl phosphonate, 2-methyl-propyl phosphonate, t-butyl phosphonate, 2,3-dimethylbutyl phosphonate, octyl phosphonate, phenyl phosphonate, dioctylphenyl phosphonate, dimethyl phosphinate, methylethyl phosphinate, methylpropyl phosphinate, diethyl phosphinate, dioctyl phosphinate, phenyl phosphinate, diethylphenyl phosphinate, dephenyl phosphinate, bis(4-methoxyphenyl)phosphinate, ammonium phosphate, ammonium polyphosphate, melamine phosphate, guanylurea phosphate, melaminepolyphosphate, guanidine phosphate, ethylenediamine phosphate, phosphazene, melamine methylphosphonate, etc.

The aforesaid flame retardants are used alone or as a combination of two or more, and among them, the hydrated metallic oxides are desirable. The aforesaid flame retardants are added in 0.1 to 5% by weight, preferably 0.5 to 2% by weight, in the epoxy resin composition for a semiconductor sealing material.

The silane-coupling agents include for example epoxysilane such as γ-glycidoxypropylmethoxysilane, aminosilane such as N-phenyl-γ-aminopropyl trimethoxy silane, ureido silane, vinyl silane, alkyl silane, mercapto silane, organic titanate, aluminum alcoholate, etc.

The release agents include for example aliphatic acids such as stearic acid, montanic acid, palmitic acid, oleic acid and linoleic acid, salts of the aliphatic acid such as calcium salt, magnesium salt, aluminum salt and zinc salt, amides of the aliphatic acid, phosphate ester, polyethylene, bis-amide, carboxyl group-containing polyolefin and natural carnauba, and they are used alone or in a combination of two or more.

The coloring agents include for example carbon black, titanium oxide, etc.

The low-stress additives include for example silicone gel, silicone rubber, silicone oil, etc.

The surface active agents include for example polyethylene glycol fatty ester, sorbitan fatty ester, fatty monoglyceride, etc.

The method of producing the epoxy resin composition for a semiconductor sealing material of the invention is not particularly limited. The red phosphorus base flame retardant (1) or (2) for an epoxy resin or the red phosphorus base flame-retardant composition (3) for an epoxy resin may be mixed while heating if necessary after the epoxy resin, the curing agent or the phenol resin is previously mixed with the aforesaid other flame retardant, curing accelerator, coloring agent, release agent and surface active agent as required. For example, there are a masterbatch method which prepares a masterbatch with some of the aforesaid components and mixes the masterbatch with other components, and a method which blends to mix all the components as they are. Either method can be selected depending on whether it is industrially advantageous.

To prepare the masterbatch, it is desired that the red phosphorus base flame retardant (1) or (2) for an epoxy resin or the red phosphorus base flame-retardant composition (3) for an epoxy resin is added as a red phosphorus content of 20 to 40% by weight, preferably 25 to 35% by weight, to the phenol resin, and the other flame retardant is added in 20 to 40% by weight, preferably 25 to 35% by weight. This masterbatch is mixed with the other components to prepare the epoxy resin composition for a semiconductor sealing material.

The epoxy resin composition for a sealing material of the invention is a plastic material which is flame retardant and excels in humidity resistant electric reliability and can be used as a sealing material, a molding material, a casting material, an adhesive agent, an electrical insulating coating material, a laminated plate, a printed circuit board, a flat cable, etc. for various types of integrated circuits and individual semiconductors of transistors and diodes.

The semiconductor sealing material of the invention is formed of the aforesaid epoxy resin composition for a sealing material and it is desired that the respective components of the epoxy resin composition for a sealing material are uniformly mixed and blended. Blending is effected by means of a roll, a kneader, a mixer or the like while heating, and after cooling, tablets are prepared by pulverizing, thereby producing the sealing material.

Using the sealing material obtained as described above, transfer molding or the like is performed to seal semiconductor devices, lead frames and the like, thus various semiconductor IC packages excelling in flame retardancy and humidity resistant electric reliability are obtained. The molding method is not particularly limited except that the sealing material formed of the aforesaid epoxy resin composition for a sealing material is used, and an ordinary molding method can be employed.

The epoxy resin composition for a sealing material of the invention has excellent flame retardancy and electric reliability, so that it has an effect useful for providing flame retardancy to the sealing material, molding material, casting material, adhesive agent, electrical insulation coating material, laminated plate, printed circuit board, flat cable, etc., which are used for various types of semiconductor integrated circuits (ICs) and individual semiconductors such as transistors and diodes. And, the sealing material can be used to obtain a semiconductor device excelling in flame retardancy and electric reliability.

The present invention will be described in detail with reference to the following examples but it is to be understood that the invention is not limited to the examples.

EXAMPLES 1–5 AND COMPARATIVE EXAMPLES 1–5

Examples and Comparative Examples of the red phosphorus base flame retardants (1), (2) for an epoxy resin will be described.

<Preparation of Coated Red Phosphorus(1)>
Coated Red Phosphorus Sample A

Bulk red phosphorus was pulverized and classified to obtain red phosphorus which had an average particle size of 20 μm, a maximum particle size of 45 μm, and 2% by weight of particles having a particle size of less than 1 μm. Water in 525 g was added to 210 g of the prepared red phosphorus to prepare a red phosphorus slurry, and 0.7 ml of an aqueous solution of hydrogen peroxide was added thereto. Then, an aqueous solution of sodium hydroxide was added to adjust a pH value to 10 and the slurry was kept at 80° C. for 6 hours. Nitric acid was then added to adjust the pH value to 1, the slurry was kept at 80° C. for 4 hours, filtered and washed with water until the slurry had a pH value of 2.5.

The washed red phosphorus in 20 g was dispersed into 180 g of pure water, aqueous ammonia was added while stirring to adjust the pH value to 10. Then, 2 g of zinc oxide (tradename "GINREY" manufactured by TOHO ZINC) having an average particle size of 0.3 μm and 3.8 g of a phenol resin (manufactured by DAINIPPON INK AND CHEMICALS, a prepolymer, "PHENOLITE TD2388": a solid content of 26%) were added, then they were stirred for 10 minutes, and hydrochloric acid was dripped to adjust the pH value to 6 to 6.5.

Then, 0.3 g of ammonium chloride was added to react at 90° C. for one hour. After allowing to cool, the reactant was filtered and washed with pure water so that the 10% slurry of 20° C. became to have an electric conductivity of 30 μs/cm or below. A filter cake was vacuum-dried while being dispersed gently, cured at 140° C. for 2 hours, allowed to cool down and filtered through a screen of 100 meshes to obtain coated red phosphorus sample A.

The coated red phosphorus had a P content of 87%.

Coated Red Phosphorus Sample B

Coated red phosphorus sample B (its 10% slurry had an electric conductivity of 16 μs/cm) was prepared by the same procedure as used to prepare the coated red phosphorus sample A except that zinc oxide was added in 3 g.

Coated Red Phosphorus Sample C

Coated red phosphorus sample C (its 10% slurry had an electric conductivity of 19 μs/cm) was prepared by the same procedure as used to prepare the coated red phosphorus sample A except that zinc oxide was added in 4 g.

Coated Red Phosphorus Sample D

Bulk red phosphorus was pulverized and classified to obtain red phosphorus which had an average particle size of 5.5 μm, a maximum particle size of 20 μm, and 2% by weight of particles having a particle size of less than 1 μm. Water in 525 g was added to 210 g of the prepared red phosphorus to prepare a red phosphorus slurry, and 0.7 ml of an aqueous solution of hydrogen peroxide was added thereto. Then, an aqueous solution of sodium hydroxide was added to adjust a pH value to 10 and the slurry was kept at 80° C. for 6 hours. Nitric acid was then added to adjust the pH value to 1, the slurry was treated at 80° C. for 4 hours, filtered and washed with water until the slurry had a pH value of 2.5.

The red phosphorus in 20 g was dispersed into 180 g of pure water, aqueous ammonia was added while stirring to adjust the pH value to 10. Then, 2 g of zinc oxide (tradename "GINREY" manufactured by TOHO ZINC) having an average particle size of 0.3 μm and 3.8 g of a phenol resin (manufactured by DAINIPPON INK AND CHEMICALS, a prepolymer, "PHENOLITE TD2388", a solid content of 26%) were added, then they were stirred for 10 minutes, and hydrochloric acid was dripped to adjust the pH value to 6 to 6.5.

Then, 0.3 g of ammonium chloride was added to react at 90° C. for one hour. After allowing to cool down, the reactant was filtered and washed so that the 10% slurry of 20° C. became to have an electric conductivity of 30 μs/cm or below. The washed slurry was passed through a screen of 20 μm, the screened product was filtered, and a filter cake was vacuum-dried while being dispersed gently. Then, post-curing was performed at 140° C. for 2 hours, the resultant product was allowed to cool and passed through a screen of 100 meshes to obtain coated red phosphorus sample D.

The coated red phosphorus had a p content of 87%. The dried red phosphorus was dispersed into water, a portion remained on the 20 μm screen was measured to be 0.01% or below.

Coated Red Phosphorus Sample E

Bulk red phosphorus was pulverized and classified to obtain red phosphorus which had an average particle size of 20 μm, a maximum particle size of 45 μm, and 2% by weight of particles having a particle size of less than 1 μm. Water in 525 g was added to 210 g of the prepared red phosphorus to prepare a red phosphorus slurry, and 0.7 ml of an aqueous solution of hydrogen peroxide was added thereto. Then, an aqueous solution of sodium hydroxide was added to adjust a pH value to 10 and the slurry was kept at 80° C. for 6 hours. Nitric acid was then added to adjust the pH value to 1, the slurry was treated at 80° C. for 4 hours, filtered and washed with water until the slurry had a pH value of 2.5.

The washed red phosphorus in 20 g was dispersed into 180 g of pure water, and aqueous ammonia was added while stirring to adjust the pH value to 10. Then, 2 g of zinc oxide (tradename "GINREY" manufactured by TOHO ZINC) having an average particle size of 0.3 μm, 1 g of titanium dioxide (manufactured by ISHIHARA SANGYO, tradename "TIPAQUE") having an average particle size of 0.2 μm and 3.8 g of a phenol resin (manufactured by DAINIPPON INK AND CHEMICALS, a prepolymer, tradename "PHENOLITE TD2388", a solid content of 26%) were added, then they were stirred for 10 minutes, and hydrochloric acid was dripped to adjust the pH value to 6 to 6.5. Then, 0.3 g of ammonium chloride was added to react at 90° C. for one hour.

After allowing to cool, the reactant was filtered and washed with pure water so that the 10% slurry became to have an electric conductivity of 30 μs/cm or below to obtain coated red phosphorus sample E.

Coated Red Phosphorus Sample F

Coated red phosphorus sample F (its 10% slurry had an electric conductivity of 103 μs/cm) was prepared by the same procedure as used to prepare the coated red phosphorus sample A except that washing of the slurry was stopped when an electric conductivity became 100 μs/cm.

Coated Red Phosphorus Sample G

Coated red phosphorus sample G (its 10% slurry had an electric conductivity of 21 μs/cm) was prepared by the same procedure as used to prepare the coated red phosphorus sample A except that zinc oxide was changed to calcium carbonate (an average particle size of 2.1 μm).

Coated Red Phosphorus Sample H

Coated red phosphorus sample H (its 10% slurry had an electric conductivity of 26 μs/cm) was prepared by the same procedure as used to prepare the coated red phosphorus sample A except that zinc oxide was changed to aluminum hydroxide (manufactured by SHOWA DENKO, "HIGILITE", an average particle size of 1.0 μm).

Coated Red Phosphorus Sample I

Coated red phosphorus sample I (its 10% slurry had an electric conductivity of 23 μs/cm) was prepared by the same procedure as used to prepare the coated red phosphorus sample A except that zinc oxide was changed to zinc hydroxide (manufactured by JUNSEI CHEMICAL, an average particle size of 0.9 μm ).

Coated Red Phosphorus Sample J

Coated red phosphorus sample J (its 10% slurry had an electric conductivity of 18 μs/cm) was prepared by the same procedure as used to prepare the coated red phosphorus sample A except that zinc oxide was not added.

<Measurement of Eluted Ions>

From the above prepared coated red phosphorus samples A to J, 8 g each was taken into a 100-ml polypropylene bottle, 80 ml of distilled water was added, and the bottle was airtightly plugged. Each sample was heated for extraction by an air blow constant temperature dryer at 80° C. for 20 hours, taken out of the drier and cooled down to normal temperature within 10 minutes. A supernatant liquid was filtered, and a concentration of eluted $PO_4$ ions and a concentration of eluted $PHO_3$ ions in the filtrate were measured by an ion chromatograph.

The eluted $PO_4$ ion concentration and the eluted $PHO_3$ ion concentration were also measured after treating under heating conditions of 150° C. and 20 hours.

A chlorine ion concentration was measured by an ion chromatograph.

Results are shown in Tables 1 to 4.

In the tables, N.D indicates that the eluted $PO_4$ ion concentration is 0.09 ppm or below.

<Measurement of Electric Conductivity>

The filtrates used to measure the eluted ions was measured for an electric conductivity at 20° C. To measure the electric conductivity, eluted ion-detecting test liquids were measured by an electric conduction meter. Results are shown in Tables 1 to 4.

<Measurement of Particle Size>

The average particle size was measured by means of a microtrack (X100 type) particle size distribution measuring device according to the laser method. The maximum particle size was measured by an analysis screen.

TABLE 1

| | Example | | | | |
|---|---|---|---|---|---|
| | 1 | 2 | 3 | 4 | 5 |
| | Type of coated red phosphorus sample | | | | |
| | A | B | C | D | E |
| P content (wt %) | 87 | 83 | 80 | 87 | 83 |
| Average particle size (μm) | 22 | 22 | 22 | 6.2 | 23 |
| Maximum particle size (μm) | 45 | 45 | 45 | 20 | 45 |
| Electric conductivity (μs/cm) *3 | 17 | 16 | 19 | 16 | 17 |
| Eluted $PO_4$ ion concentration (ppm) *1 | N.D. | N.D. | N.D. | N.D. | N.D. |
| Eluted $PHO_3$ ion concentration (ppm) *1 | 223 | 210 | 201 | 230 | 136 |
| Chlorine ion concentration (ppm) *1 | 13 | 15 | 12 | 15 | 13 |
| Electric conductivity (μs/cm) *1 | 44 | 41 | 40 | 47 | 48 |

TABLE 2

| | Example | | | | |
|---|---|---|---|---|---|
| | 1 | 2 | 3 | 4 | 5 |
| | Type of coated red phosphorus sample | | | | |
| | A | B | C | D | E |
| Eluted $PO_4$ ion concentration (ppm) *2 | 457 | 423 | 419 | 200 | 420 |
| Eluted $PHO_3$ ion concentration (ppm) *2 | 1287 | 1251 | 1249 | 516 | 1270 |
| Chlorine ion concentration (ppm) *2 | 11 | 10 | 11 | 22 | 13 |
| Electric conductivity (μs/cm) *2 | 1442 | 1393 | 1379 | 1340 | 1338 |

TABLE 3

| | Comparative Example | | | | |
|---|---|---|---|---|---|
| | 1 | 2 | 3 | 4 | 5 |
| | Type of coated red phosphorus sample | | | | |
| | F | G | H | I | J |
| P content (wt %) | 87 | 87 | 87 | 87 | 95 |
| Average particle size (μm) | 23 | 22 | 23 | 23 | 22 |
| Maximum Particle size (μm) | 45 | 45 | 45 | 45 | 45 |
| Electric conductivity (μs/cm) *3 | 113 | 21 | 26 | 23 | 18 |
| Eluted $PO_4$ ion concentration (ppm) *1 | N.D. | 14 | 5 | 5 | 101 |
| Eluted $PHO_3$ ion concentration (ppm) *1 | 271 | 421 | 335 | 366 | 288 |
| Chlorine ion concentration (ppm) *1 | 38 | 11 | 13 | 62 | 13 |
| Electric conductivity (μs/cm) *1 | 173 | 202 | 163 | 166 | 170 |

TABLE 4

| | Comparative Example | | | | |
|---|---|---|---|---|---|
| | 1 | 2 | 3 | 4 | 5 |
| | Type of coated red phosphorus sample | | | | |
| | F | G | H | I | J |
| Eluted $PO_4$ ion concentration (ppm) *2 | 473 | 1501 | 1232 | 497 | 1368 |
| Eluted $PHO_3$ ion concentration (ppm) *2 | 1329 | 1713 | 1802 | 1634 | 1781 |
| Chlorine ion concentration (ppm) *2 | 105 | 16 | 15 | 65 | 17 |
| Electric conductivity (μs/cm) *2 | 2111 | 3732 | 2622 | 2502 | 2532 |

(Notes)
(1) In the tables, *1 and *2 indicate measuring conditions of 80° C. × 20 hrs and 150° C. × 20 hrs, respectively.
(2) Electric conductivity *3 indicates an electric conductivity determined when the coated red phosphorus sample was prepared as a 10% slurry at 20° C.
(3) Electric conductivities *1, *2 indicate those of the filtrates undergone the eluted ion test.

Then, 30 parts by weight of the above prepared coated red phosphorus, 35 parts by weight of aluminum hydroxide (SUMITOMO CHEMICAL; CL-310, an average particle size of 11 μm ) as an inorganic base flame retardant, and 35 parts by weight of a novolac type phenol resin (a curing agent, SUMITOMO BAKELITE; PR53195) were uniformly mixed to prepare each masterbatch.

<Evaluation as Semiconductor Sealing Material>
Epoxy Resin Composition for Semiconductor Sealing Material (Part by Weight)

| | |
|---|---|
| Epoxy resin (YUKA SHELL, YX-4000H) | 113.98 parts |
| Phenol resin (GUN-EI CHEMICAL INDUSTRY, PSM4261) | 61.50 parts |
| Triphenyl phosphine (HOKKO CHEMICAL INDUSTRY) | 2.26 parts |
| OP wax (HOECHST) | 1.13 parts |
| Carbon black (MITSUBISHI CHEMISTRY) | 1.13 parts |
| Fused spherical silica (NIPPON CHEMICAL INDUSTRIAL, "SILSTAR M2430") | 820.0 parts |
| Masterbatch | 33.3 parts |

The above components of the epoxy resin composition were mixed by a mixer at normal temperature, blended by a biaxial heated roller at 80 to 85° C. for seven minutes. Peeling, cooling and pulverization were performed to prepare an epoxy resin sealing material.

Using the prepared sealing material, a spiral flow was measured by a transfer molding press under conditions that a molding temperature was 175° C., a molding resin pressure was 7 MPa (70 kg/cm$^2$) and molding time was 120 seconds, and samples of 10 mm×100 mm×3 mm thick (about 5 g) were also molded as elution test samples. And, samples of 12.5 mm×125 mm×1 mm thick were molded for a burning test. Those samples were tested for burning by UL-94 and heat promotion of eluted ions by PCT.

Results are shown in Tables 5 and 6.

Humidity resistance and high-temperature storage life were also tested, and results are shown in Tables 7 and 8.

TABLE 5

| | Example | | | | |
|---|---|---|---|---|---|
| | 1 | 2 | 3 | 4 | 5 |
| Spiral flow (relative value) | 100 | 100 | 100 | 100 | 100 |
| UL-94 | V-0 | V-0 | V-0 | V-0 | V-0 |
| Eluted PO$_4$ ion (ppm) *1 | 1.8 | 1.5 | 1.6 | 2.1 | 2.0 |
| Eluted PHO$_3$ ion (ppm) *1 | 0.7 | 0.6 | 0.4 | 0.7 | N.D. |
| Electric conductivity (μs/cm) *1 | 9 | 9 | 9 | 10 | 4.4 |
| Eluted PO$_4$ ion (ppm) *2 | 98 | 95 | 74 | 99 | 98 |
| Eluted PHO$_3$ ion (ppm) *2 | 85 | 50 | 34 | 97 | 84 |
| Electric conductivity (μs/cm) *2 | 50 | 46 | 46 | 66 | 62 |

TABLE 6

| | Comparative Example | | | | |
|---|---|---|---|---|---|
| | 1 | 2 | 3 | 4 | 5 |
| Spiral flow (relative value) | 100 | 100 | 100 | 100 | 100 |
| UL-94 | V-0 | V-0 | V-0 | V-0 | V-0 |
| Eluted PO$_4$ ion (ppm) *1 | 2.5 | 5.2 | 4.1 | 2.3 | 4.5 |
| Eluted PHO$_3$ ion (ppm) *1 | 0.9 | 1.4 | 0.9 | 0.8 | 1.0 |

TABLE 6-continued

| | Comparative Example | | | | |
|---|---|---|---|---|---|
| | 1 | 2 | 3 | 4 | 5 |
| Electric conductivity (μs/cm) *1 | 13 | 11 | 11 | 18 | 19 |
| Eluted PO$_4$ ion (ppm) *2 | 172 | 288 | 265 | 181 | 326 |
| Eluted PHO$_3$ ion (ppm) *2 | 101 | 165 | 149 | 64 | 186 |
| Electric conductivity (μs/cm) *2 | 81 | 116 | 112 | 126 | 128 |

(Note)
In the above tables, *1 and *2 indicate measuring conditions of 80° C. × 20 hrs and 150° C. × 20 hrs, respectively.

<Burning Test by UL-94>

Molded samples were tested for vertical burning by a UL94 burning tester manufactured by SUGA TEST INSTRUMENTS, and V-0 to V2 were judged depending on the burning time and the presence or not of dripping.

<Heat Promotion Test of Eluted Ions by PCT>

One molded sample and 80 g of distilled water were put in a Teflon pressure resisting reactor having an inside capacity of 100 ml, heated at 150° C. for 20 hours and cooled. The solution was measured for its eluted ion concentration and electric conductivity. The test was also performed under heating conditions of 80° C.×20 hrs.

In Tables 5 and 6, *1 and *2 indicate the measuring conditions 80° C.×20 hrs and 150° C.×20 hrs, respectively.

<Humidity Resistance test>

An 80-pin flat package having an external size of 19×14× 2.7 mm, which had thereon a 6×6×0.4 mm test silicon chip with aluminum wiring of 10 μm wide and 1 μm thick thereon, was produced by transfer molding of the aforesaid epoxy resin sealing material. The package was pretreated, humidified and examined for the number of failure broken lines due to corrosion of the aluminum wiring at every predetermined time intervals. The flat package was produced by sealing the sealing material by the transfer press under the conditions of 180±3° C., 6.9 ±0.17 MPa and 90 seconds and curing at 180±5° C. for five hours. By the pretreatment, the flat package was humidified under conditions of 85° C., 85% RH and 72 hours, and subjected to a vapor phase reflow treatment at 215° C. for 90 seconds. The moisturing test was performed under conditions of 2.02×10$^5$ Pa, 121° C. and 85% RH.

<High-temperature Storage Life>

A test device was prepared by forming aluminum wiring with a space between lines of 10 μm on a silicon substrate having an oxide film with an outside size of 5×9 mm and 5 μm thick. The test device was connected to a partly silver-plated 42 alloy lead frame with a silver paste, and a bonding pad of the test device was connected to inner leads with Au wires at 200° C. by a thermonic wire bonder. Then, 16-pin type DIP (Dual Inline Package) was produced from the above prepared epoxy resin sealing material by transfer molding. The obtained test IC was stored in a high-temperature bath of 200° C. and taken out at predetermined time intervals to examine the number of failures by conduction testing. The test IC was produced by sealing the sealing material by a transfer press under conditions of 180±3° C., 6.9±0.17 MPa and 90 seconds and curing at 180° C.±5° C. for five hours.

TABLE 7

|  |  | Example | | | | |
| --- | --- | --- | --- | --- | --- | --- |
|  |  | 1 | 2 | 3 | 4 | 5 |
| Humidity resistance | 600 hours | 0/10 | 0/10 | 0/10 | 0/10 | 0/10 |
|  | 800 hours | 0/10 | 0/10 | 0/10 | 0/10 | 0/10 |
|  | 1000 hours | 0/10 | 0/10 | 0/10 | 0/10 | 0/10 |
|  | 1200 hours | 0/10 | 0/10 | 0/10 | 0/10 | 0/10 |
| High-temp. storage life | 400 hours | 0/10 | 0/10 | 0/10 | 0/10 | 0/10 |
|  | 600 hours | 0/10 | 0/10 | 0/10 | 0/10 | 0/10 |
|  | 800 hours | 0/10 | 0/10 | 0/10 | 0/10 | 0/10 |
|  | 1000 hours | 0/10 | 0/10 | 0/10 | 0/10 | 0/10 |

TABLE 8

|  |  | Comparative Example | | | | |
| --- | --- | --- | --- | --- | --- | --- |
|  |  | 1 | 2 | 3 | 4 | 5 |
| Humidity resistance | 600 hours | 0/10 | 1/10 | 2/10 | 2/10 | 1/10 |
|  | 800 hours | 1/10 | 3/10 | 4/10 | 3/10 | 3/10 |
|  | 1000 hours | 2/10 | 3/10 | 5/10 | 3/10 | 3/10 |
|  | 1200 hours | 4/10 | 5/10 | 7/10 | 5/10 | 5/10 |
| High-temp. storage life | 400 hours | 1/10 | 2/10 | 2/10 | 2/10 | 2/10 |
|  | 600 hours | 2/10 | 4/10 | 4/10 | 4/10 | 4/10 |
|  | 800 hours | 3/10 | 5/10 | 5/10 | 5/10 | 5/10 |
|  | 1000 hours | 4/10 | 8/10 | 8/10 | 8/10 | 8/10 |

(Note)
The above tables show ten samples tested for evaluation and the number of defective samples.

EXAMPLES 6–8 AND COMPARATIVE EXAMPLES 6–8

<Preparation of Double-coated Red Phosphorus (2)>

Double Coated Red Phosphorus Sample K

Bulk red phosphorus was pulverized and classified to obtain red phosphorus which had an average particle size of 20 μm, a maximum particle size of 45 μm, and 2% by weight of particles having a particle size of less than 1 μm. Water in 525 g was added to 210 g of the prepared red phosphorus to prepare a red phosphorus slurry, and 0.7 ml of an aqueous solution of hydrogen peroxide was added thereto. Then, an aqueous solution of sodium hydroxide was added to adjust a pH value to 10 and the resultant slurry was kept at 80° C. for 6 hours. Nitric acid was then added to adjust the pH value to 1, the slurry was kept at 80° C. for 4 hours and filtered. And, the obtained precipitate was washed with water until its slurry became to have a pH value of 2.5.

Red phosphorus powder in 100 g was suspended in 800 ml of pure water to prepare a red phosphorus slurry. Then, 16.3 g of an aqueous solution of aluminum sulfate in 8% by weight as $Al_2O_3$ was added, and 10% by weight of an aqueous solution of sodium hydroxide was added at 80° C. while stirring until the pH value was adjusted to 6.6. After completing the addition, stirring was further continued at 80° C. for two hours to deposit aluminum hydroxide. At that time, a coated amount of aluminum hydroxide was 1.0% by weight.

Then, the coated red phosphorus was separated and recovered by filtering the reaction liquid by a conventional procedure, and water was added again to prepare a slurry. After repulping by a conventional procedure, filtering and repulping were repeated until an electric conductivity of a 10% slurry of the coated red phosphorus became 300 μs/cm or below. After washing, 20 g of red phosphorus was dispersed into 180 g of pure water, and a phenol resin containing zinc oxide was further coated by the same procedure as used to prepare the coated red phosphorus sample A to obtain double-coated red phosphorus sample K.

Double Coated Red Phosphorus Sample L

Bulk red phosphorus was pulverized and classified to obtain red phosphorus which had an average particle size of 20 μm, a maximum particle size of 45 μm, and 2% by weight of particles having a particle size of less than 1 μm. Water in 525 g was added to 210 g of the prepared red phosphorus to prepare a red phosphorus slurry, and 0.7 ml of an aqueous solution of hydrogen peroxide was added thereto. Then, an aqueous solution of sodium hydroxide was added to adjust a pH value to 10 and the resultant slurry was kept at 80° C. for six hours. Nitric acid was then added to adjust the pH value to 1, the slurry was kept at 80° C. for 4 hours and filtered. And, the precipitate was washed with water until its slurry became to have a pH value of 2.5.

A red phosphorus slurry was prepared by suspending 100 g of the obtained red phosphorus powder in 800 ml of water. Then, 16.3 g of an aqueous solution of aluminum sulfate in 8% by weight as $Al_2O_3$ and 2.5 g of an aqueous solution of titanium tetrachloride in 8.5% by weight as Ti were added, and 3% by weight of an aqueous solution of ammonia was added at a temperature of 80° C. while stirring until the pH value became 7.0. After completing the addition, stirring was further continued at 80° C. for two hours to deposit aluminum hydroxide and titanium hydroxide. At that time, a coated amount of aluminum hydroxide was 1.0% by weight, and a coated amount of titanium hydroxide was 0.5% by weight.

Then, the coated red phosphorus was separated and recovered by filtering the reaction liquid by a conventional procedure, and water was added again to prepare a slurry. Repulping was performed by a conventional procedure, and filtering and repulping were repeated until an electric conductivity of a 10% slurry of the coated red phosphorus became 300 μs/cm or below. After washing, 20 g of the red phosphorus was dispersed into 180 g of pure water, and a phenol resin containing zinc oxide was further coated by the same procedure as used to prepare the coated red phosphorus sample A to obtain double-coated red phosphorus sample L.

Double Coated Red Phosphorus Sample M

Bulk red phosphorus was pulverized and classified to obtain red phosphorus which had an average particle size of 5.5 μm, a maximum particle size of 20 μm, and 2% by weight of particles having a particle size of less than 1 μm. Water in 525 g was added to 210 g of the prepared red phosphorus to prepare a red phosphorus slurry, and 0.7 ml of an aqueous solution of hydrogen peroxide was added thereto. Then, an aqueous solution of sodium hydroxide was added to adjust a pH value to 10 and the resultant slurry was kept at 80° C. for six hours. Nitric acid was then added to adjust the pH value to 1, the slurry was kept at 80° C. for 4 hours and filtered. And, the precipitate was washed with water until its slurry became to have a pH value of 2.5.

A red phosphorus slurry was prepared by suspending 100 g of the red phosphorus powder in 800 ml of water. Then, 16.3 g of an aqueous solution of aluminum sulfate in 8% by weight as $Al_2O_3$ and 1.38 g of an aqueous solution of zirconium sulfate in 28.0% byweight as $ZrO_2$ were added, and 3% by weight of an aqueous solution of ammonia was added at a temperature of 80° C. while stirring until the pH value became 7.0. After completing the addition, stirring was further continued at 80° C. for two hours to deposit aluminum hydroxide and zirconium hydroxide. At that time, a coated amount of aluminum hydroxide was 1.0% by weight, and a coated amount of zirconium hydroxide was 0.5% by weight.

Then, the coated red phosphorus was separated and recovered by filtering the reaction liquid by a conventional procedure, and water was added again to prepare a slurry. Repulping was performed by a conventional procedure, and filtering and repulping were repeated until an electric conductivity of a 10% slurry of the coated red phosphorus became 300 μs/cm or below. After washing, 20 g of the red phosphorus was dispersed into 180 g of pure water, and a phenol resin containing zinc oxide was further coated by the same procedure as used to prepare the coated red phosphorus sample A to obtain double-coated red phosphorus sample M.

Double Coated Red Phosphorus Sample N

Double coated red phosphorus sample N was obtained by coating the surface of red phosphorus particles with aluminum hydroxide and further coating with aphenol resin containing zinc hydroxide by the same procedure as used to prepare the coated red phosphorus sample K except that zinc hydroxide (an average particle size of 0.9 μm) was used instead of zinc oxide.

Double Coated Red Phosphorus Sample O

Bulk red phosphorus was pulverized and classified to obtain red phosphorus which had an average particle size of 20 μm, a maximum particle size of 45 μm, and 2% by weight of particles having a particle size of less than 1 μm. The prepared red phosphorus powder in 100 g was suspended in800 ml of water to prepare a red phosphorus slurry. Then, 16.3 g of an aqueous solution of aluminum sulfate in 8% by weight as $Al_2O_3$ was added, and 10% by weight of an aqueous solution of sodium hydroxide was added at a temperature of 80° C. while stirring until the pH value became 6.6. After completing the addition, stirring was further continued at 80° C. for two hours to deposit aluminum hydroxide. At that time, a coated amount of aluminum hydroxide was 1.0% by weight. After completing the reaction, the reaction solution had an electric conductivity of 13700 μs/cm.

Then, without washing the above resultant, a phenol resin containing zinc oxide was further coated by the same procedure as used to prepare the coated red phosphorus sample A to obtain double-coated red phosphorus sample O.

Double Coated Red Phosphorus Sample P

Double coated red phosphorus sample P (its 10% slurry had an electric conductivity of 103 μs/cm) was prepared by the same procedure as used to prepare the double-coated red phosphorus sample K except that the washing of the slurry in the final stage was stopped when the electric conductivity became 100 μs/cm.

From the prepared coated red phosphorus samples K to P, 8.0 g each was measured for eluted ions and electric conductivity by the same procedure as used in Examples 1–5 and Comparative Examples 1–5. Results are shown in Tables 9 and 10.

TABLE 9

| | Example | | | Comparative Example | | |
|---|---|---|---|---|---|---|
| | 6 | 7 | 8 | 6 | 7 | 8 |
| | \multicolumn{6}{c}{Type of coated red phosphorus sample} | | | | | |
| | K | L | M | N | O | P |
| P content (wt %) | 86.2 | 85.9 | 85.9 | 86.2 | 86.2 | 86.2 |
| Average particle size (μm) | 23 | 23 | 6.2 | 24 | 23 | 23 |
| Maximum Particle size (μm) | 45 | 45 | 20 | 45 | 45 | 45 |

TABLE 9-continued

| | Example | | | Comparative Example | | |
|---|---|---|---|---|---|---|
| | 6 | 7 | 8 | 6 | 7 | 8 |
| | K | L | M | N | O | P |
| Electric conductivity (μs/cm) *3 | 18 | 16 | 16 | 28 | 29 | 120 |
| Eluted $PO_4$ ion concentration (ppm) *1 | N.D. | N.D. | N.D. | N.D. | 3.2 | N.D. |
| Eluted $PHO_3$ ion concentration (ppm) *1 | 3.4 | 3.2 | 6.4 | 66 | 52 | 13.4 |
| Chlorine ion concentration (ppm) *1 | 6.1 | 8.5 | 4.1 | 62 | 150 | 48 |
| Electric conductivity (μs/cm) *1 | 22 | 20 | 27 | 47 | 211 | 166 |

TABLE 10

| | Example | | | Comparative Example | | |
|---|---|---|---|---|---|---|
| | 6 | 7 | 8 | 6 | 7 | 8 |
| | K | L | M | N | O | P |
| Eluted $PO_4$ ion concentration (ppm) *2 | 180 | 163 | 192 | 199 | 321 | 189 |
| Eluted $PHO_3$ ion concentration (ppm) *2 | 496 | 471 | 512 | 1021 | 983 | 600 |
| Chlorine ion concentration (ppm) *2 | 22 | 17 | 15 | 71 | 163 | 65 |
| Electric conductivity (μs/cm) *2 | 1120 | 1098 | 1213 | 2136 | 2820 | 2411 |

(Notes)
(1) In the tables, *1 and *2 indicate measuring conditions 80° C. × 20 hrs and 150° C. × 20 hrs, respectively.
(2) Electric conductivity *3 indicates an electric conductivity when the coated red phosphorus sample was prepared as a 10% slurry at 20° C.
(3) Electric conductivities *1 and *2 indicate those of the filtrates undergone the eluted ion test.

Then, 30 parts by weight of the above prepared double-coated red phosphorus, 35 parts by weight of aluminum hydroxide (SUMITOMO CHEMICAL; CL-310, an average particle size of 11 μm) as an inorganic base flame retardant, and 35 parts by weight of a novolac type phenol resin (a curing agent, SUMITOMO BAKELITE; PR53195) were uniformly mixed to prepare each masterbatch.

<Evaluation as Semiconductor Sealing Material>

Epoxy Resin Composition for Semiconductor Sealing Material (Part by Weight)

| | |
|---|---|
| Epoxy resin (YUKA SHELL, YX-4000H) | 113.98 parts |
| Phenol resin (GUN-EI CHEMICAL INDUSTRY, PSM4261) | 61.50 parts |
| Triphenyl phosphine (HOKKO CHEMICAL INDUSTRY) | 2.26 parts |
| OP wax (HOECHST) | 1.13 parts |
| Carbon black (MITSUBISHI CHEMISTRY) | 1.13 parts |
| Fused spherical silica (NIPPON CHEMICAL INDUSTRIAL, SILSTAR M2430) | 820.0 parts |
| Masterbatch | 30.0 parts |

The above components of the epoxy resin composition were mixed by a mixer at normal temperature, blended by a biaxial heated roller at 80 to 85° C. for seven minutes. Peeling, cooling and pulverization were performed to prepare an epoxy resin sealing material. Using the prepared sealing material, a spiral flow was measured by a transfer molding press under conditions that a molding temperature was 175° C., a molding resin pressure was 7 MPa (70 kg/cm$^2$) and molding time was 120 seconds. And, samples of 10 mm×100 mm×3 mm thick were molded as elution test samples. Samples of 12.5 mm×125 mm×1 mm thick were also molded for burning testing.

These samples were subjected to the burning test by UL-94 and the heating promotion test of eluted ions by PCT according to the same procedure as used in Examples 1–5 and Comparative Examples 1–5. Results are shown in Table 11.

Besides, humidity resistance and high-temperature storage life were tested by the same procedures as in Examples 1–5 and Comparative Examples 1–5, and results are shown in Table 12.

In the table, N.D indicates that the eluted PHO$_3$ ion concentration is 0.09 ppm or below.

TABLE 11

|  | Example | | | Comparative Example | | |
|---|---|---|---|---|---|---|
|  | 6 | 7 | 8 | 6 | 7 | 8 |
| Type of coated red phosphorus sample | K | L | M | N | O | P |
| Spiral flow (relative value) | 100 | 100 | 100 | 100 | 100 | 100 |
| UL-94 | V-0 | V-0 | V-0 | V-0 | V-0 | V-0 |
| Eluted PO$_4$ ion (ppm) *1 | 1.2 | 1.7 | 1.4 | 2.5 | 6.1 | 7.1 |
| Eluted PHO$_3$ ion (ppm) *1 | N.D. | N.D. | N.D. | N.D. | 1.1 | 1.0 |
| Electric conductivity (μs/cm) *1 | 4.1 | 2.9 | 4.7 | 6.2 | 8.5 | 7.1 |
| Eluted PO$_4$ ion (ppm) *2 | 94 | 77 | 92 | 146 | 121 | 181 |
| Eluted PHO$_3$ ion (ppm) *2 | 61 | 35 | 60 | 65 | 81 | 77 |
| Electric conductivity (μs/cm) *2 | 68 | 45 | 65 | 112 | 135 | 133 |

TABLE 12

|  |  | Example | | | Comparative Example | | |
|---|---|---|---|---|---|---|---|
|  |  | 6 | 7 | 8 | 6 | 7 | 8 |
| Humidity resistance | 600 hours | 0/10 | 0/10 | 0/10 | 0/10 | 1/10 | 0/10 |
|  | 800 hours | 0/10 | 0/10 | 0/10 | 1/10 | 2/10 | 1/10 |
|  | 1000 hours | 0/10 | 0/10 | 0/10 | 2/10 | 4/10 | 2/10 |
|  | 1200 hours | 0/10 | 0/10 | 0/10 | 3/10 | 5/10 | 4/10 |
| High-temp. storage life | 400 hours | 0/10 | 0/10 | 0/10 | 2/10 | 1/10 | 1/10 |
|  | 600 hours | 0/10 | 0/10 | 0/10 | 3/10 | 2/10 | 2/10 |
|  | 800 hours | 0/10 | 0/10 | 0/10 | 4/10 | 3/10 | 3/10 |
|  | 1000 hours | 0/10 | 0/10 | 0/10 | 7/10 | 4/10 | 4/10 |

EXAMPLES 9–11 AND COMPARATIVE EXAMPLES 9–11

Examples and Comparatives Examples of the red phosphorus base flame-retardant composition (3) for an epoxy resin will be described.

<Preparation of Flame-retardant Stabilized Red Phosphorus>

Bulk red phosphorus was pulverized and classified to obtain red phosphorus which had an average particle size of 20 μm, a maximum particle size of 45 μm, and 2% by weight of particles having a particle size of less than 1 μm. Water in 525 g was added to 210 g of the prepared red phosphorus to prepare a red phosphorus slurry, and nitric acid was added to adjust the pH value to 1. The slurry was kept at 80° C. for 4 hours, filtered and washed with water until the slurry became to have a pH value of 2.5.

The prepared red phosphorus in 100 g was dispersed into 1000 ml of water, and aluminum sulfate in an amount equivalent to 1 g of aluminum hydroxide (Al(OH)$_3$) was added while stirring. After completing the addition, stirring was further continued for 30 minutes, sodium hydroxide was added to adjust the pH of the slurry to 8.0. Then, the liquid temperature was increased to 85° C. and the liquid was aged at 85° C. for two hours. After allowing to cool down, filtering and washing were performed until the 10% slurry became to have the electric conductivity of 100 μs/cm or below.

The obtained filter cake was dispersed into water, a phenol resin (DAINIPPON INK AND CHEMICALS, a prepolymer, "PHENOLITE TD2388") in an amount equivalent to 5% of red phosphorus as a solid content was added while stirring, and hydrochloric acid was added to adjust the pH of the slurry to 2 or below. The slurry was heated and kept at 90° C. for one hour to complete the curing reaction of the phenol resin.

After allowing to cool down, the slurry was fully filtered and washed. The filter cake was vacuum-dried and left standing at 140° C. for one hour. After allowing to cool down, the resultant product was passed through a 150 μm screen to obtain flame-retardant stabilized red phosphorus of the resin coated red phosphorus. The P content in the flame-retardant stabilized red phosphorus was 94.1%. The 10% slurry of the flame-retardant stabilized red phosphorus had an electric conductivity of 30 μs/cm or below.

On the basis of the prepared flame-retardant stabilized red phosphorus, zinc oxide (an average particle size of 0.6 μm) and calcium carbonate (an average particle size of 2.11 μm) were added and mixed in the ratios shown in Table 13 to obtain red phosphorus base flame-retardant compositions.

PHO$_3^{-2}$ and PO$_4^{-3}$ of the obtained red phosphorus base flame-retardant compositions were tested for elution and measured for an electric conductivity at 80° C. by the same procedure as in Examples 1–5 and Comparative Examples 1–5. Results are shown in Table 13.

COMPARATIVE EXAMPLE 12

<Preparation of Flame-retardant Stabilized Red Phosphorus>

Bulk red phosphorus was pulverized and classified to obtain red phosphorus which had an average particle size of 20 μm, a maximum particle size of 45 μm, and 2% by weight of particles having a particle size of less than 1 μm. Water in 525 g was added to 210 g of red phosphorus to prepare a red phosphorus slurry, and nitric acid was added to adjust the pH value to 1. The slurry was kept at 80° C. for 4 hours, filtered and washed with water until the slurry became to have a pH value of 2.5.

The prepared red phosphorus in 100 g was dispersed into 1000 ml of water, and aluminum sulfate in an amount equivalent to 1 g of aluminum hydroxide ($Al(OH)_3$) was added while stirring. After completing the addition, stirring was continued for 30 minutes, and sodium hydroxide was added to adjust the pH of the slurry to 8.0. Then, the liquid temperature was increased to 85° C. and the liquid was aged at 85° C. for two hours. After allowing to cool down (the electric conductivity of 14500 μs/cm of the reaction solution after completing the reaction), a phenol resin (DAINIPPON INK AND CHEMICALS, a prepolymer, "PHENOLITE TD2388") was added in an amount equivalent to 5% of the red phosphorus as a sold substance while stirring, and hydrochloric acid was further added to adjust the slurry to have a pH value of 2 or below. The slurry was heated and kept at 90° C. for one hour to complete the curing reaction of the phenol resin.

After allowing to cool down, the slurry was fully filtered and washed. The filter cake was vacuum-dried, left standing at 140° C. for one hour and cured. After allowing to cool down, it was passed through a 150 μm screen to obtain flame-retardant stabilized red phosphorus of resin coated red phosphorus. The P content in the flame-retardant stabilized red phosphorus was 94.1%. The 10% slurry of the flame-retardant stabilized red phosphorus had an electric conductivity of 30 μs/cm or below.

On the basis of the prepared flame-retardant stabilized red phosphorus, zinc oxide (an average particle size of 0.6 μm) was added and mixed in the ratio shown in Table 13 to obtain red phosphorus base flame-retardant compositions.

$PHO_3^{-2}$ and $PO_4^{-3}$ of the obtained red phosphorus base flame-retardant composition were tested for elution and measured for an electric conductivity at 80° C. and 150° C. by the same procedure as in Examples 1–5 and Comparative Examples 1–5. Results are shown in Table 13.

phosphorus of the Examples 9–11 and mixing them have a high trapping effect of eluted phosphorus compared with the flame retardant formed of the flame-retardant stabilized red phosphorus only or the flame retardant with calcium carbonate added. It is also seen that the red phosphorus base flame-retardant compositions of the Examples 9–11 have an electric conductivity of 50 μs/cm or below and an amount of eluted ionic impurities is apparently smaller than in Comparative Examples 9–12.

EXAMPLES 12–14 AND COMPARATIVE EXAMPLES 13–15

Based on the flame-retardant stabilized red phosphorus of resin-coated red phosphorus prepared in Examples 9–11, zinc oxide and calcium carbonate were added and mixed in the ratios shown in Table 14. Respective mixtures were heated in an atmosphere of nitrogen at 175° C. for four hours, and cooled to normal temperature to obtain red phosphorus base flame-retardant compositions.

The obtained red phosphorus base flame-retardant compositions were tested for elution of $PHO_3^{-2}$ and $PO_4^{-3}$ and measured for an electric conductivity at 80° C. and 150° C. by the same procedure as in Examples 9–11. Results are shown in Table 14.

COMPARATIVE EXAMPLE 16

Based on the flame-retardant stabilized red phosphorus of the resin-coated red phosphorus prepared in Comparative Example 12, zinc oxide was added and mixed in the ratio shown in Table 14, and the mixture was heated in an atmosphere of nitrogen at 175° C. for four hours and cooled to normal temperature to obtain a red phosphorus base flame-retardant composition.

The obtained red phosphorus base flame-retardant composition was tested for elution of $PHO_3^{-2}$ and $PO_4^{-3}$ and measured for an electric conductivity at 80° C. and 150° C. by the same procedure as in Examples 9–11. Results are shown in Table 14.

TABLE 13

|  | Example | | | Comparative Example | | | |
| --- | --- | --- | --- | --- | --- | --- | --- |
|  | 9 | 10 | 11 | 9 | 10 | 11 | 12 |
| Flame-retardant stabilized red Phosphorus (part) | 100 | 100 | 100 | 100 | 100 | 100 | 100 |
| Zinc oxide (part) | 7.5 | 14.0 | 10.0 | — | — | — | 10.0 |
| Calcium carbonate (part) | — | — | — | 10.0 | 19.0 | — | — |
| Eluted $PO_4$ ion (ppm) *1 | 1 or less | 1 or less | N.D. | 23.1 | 13.8 | 23.8 | 12.1 |
| Eluted $PHO_3$ ion (ppm) *1 | 58.1 | 61.3 | 5 | 154 | 110 | 86.1 | 81.1 |
| Electric conductivity (μs/cm) *1 | 39 | 37 | 34 | 173 | 202 | 170 | 230 |
| Eluted $PO_4$ ion (ppm) *2 | 471 | 433 | 452 | 1632 | 1539 | 2117 | 551 |
| Eluted $PHO_3$ ion (ppm) *2 | 1322 | 1270 | 1299 | 1350 | 1523 | 1748 | 1472 |
| Electric conductivity (μs/cm) *2 | 1620 | 1414 | 1561 | 3123 | 3356 | 3667 | 2412 |

(Note)
In the table, *1 and *2 indicate measuring conditions 80° C. × 20 hrs and 150° C. × 20 hrs, respectively.

It is apparent from the results shown in Table 13 that the red phosphorus base flame-retardant compositions prepared by adding zinc oxide to the flame-retardant stabilized red

TABLE 14

|  | Examples ||| Comparative Examples ||||
| --- | --- | --- | --- | --- | --- | --- | --- |
|  | 12 | 13 | 14 | 13 | 14 | 15 | 16 |
| Flame-retardant stabilized red Phosphorus (part) | 100 | 100 | 100 | 100 | 100 | 100 | 100 |
| Zinc oxide (part) | 7.5 | 14.0 | 10.0 | — | — | — | 10.0 |
| Calcium carbonate (part) | — | — | — | 10.0 | 19.0 | — | — |
| Eluted $PO_4$ ion (ppm) *1 | 1 or less | 6.3 | N.D. | 55.0 | 48.0 | 373 | 10.3 |
| Eluted $PHO_3$ ion (ppm) *1 | 135 | 82.6 | 80.0 | 249 | 211 | 216 | 101 |
| Electric conductivity ($\mu$s/cm) *1 | 57 | 49 | 49 | 257 | 315 | 280 | 293 |
| Eluted $PO_4$ ion (ppm) *2 | 485 | 451 | 480 | 1969 | 1821 | 2511 | 591 |
| Eluted $PHO_3$ ion (ppm) *2 | 1421 | 1359 | 1392 | 1581 | 1733 | 2135 | 1591 |
| Electric conductivity ($\mu$s/cm) *2 | 1810 | 1620 | 1601 | 3521 | 3855 | 4511 | 2561 |

(Note)
In the table, *1 and *2 indicate measuring conditions 80° C. × 20 hrs and 150° C. × 20 hrs, respectively.

It is apparent from Table 14 that even when the flame-retardant stabilized red phosphorus samples were heated and tested for elution, a trapping effect of eluted ions was remarkable in Examples 12–14 in which zinc oxide was added. It is also apparent that the electric conductivity of the samples in Examples 12–14 is low to a level of about ⅕ of the samples in Comparative Examples 13–16.

EXAMPLES 15–17

Red phosphorus base flame-retardant compositions were prepared as mixture powder by adding 7 parts by weight (Example 15), 14 parts by weight (Example 16) and 10 parts by weight (Example 17) of zinc oxide to 100 parts by weight of the flame-retardant stabilized red phosphorus prepared in Example 9–11, respectively.

Besides, each masterbatch was prepared by uniformly mixing 30 parts by weight of each of the red phosphorus base flame-retardant compositions of the mixture powder, 35 parts by weight of aluminum hydroxide (SUMITOMO CHEMICAL, CL-310, an average particle size of 11 $\mu$m) as an inorganic base flame retardant, and 35 parts by weight of a novolac type phenol resin (a curing agent manufactured by SUMITOMO BAKELITE, PR53195).

COMPARATIVE EXAMPLE 17

A masterbatch was prepared from 30 parts by weight of the flame-retardant stabilized red phosphorus prepared in Comparative Example 9–11, 35 parts by weight of aluminum hydroxide (CL-310 manufactured by SUMITOMO CHEMICAL) as an inorganic base flame retardant, and 35 parts by weight of a novolac type phenol resin (a curing agent manufactured by SUMITOMO BAKELITE, PR53195).

COMPARATIVE EXAMPLES 18 AND 19

Flame retardant stabilized red phosphorus each was prepared by the same procedure of preparing the flame-retardant stabilized red phosphorus as in Example 9–11 except that washing after the curing reaction of the slurry phenol resin in the final step was stopped when the electric conductivity became 100 $\mu$s/cm.

Mixture powder each was obtained by adding 7 parts by weight (Comparative Example 18) and 14 parts by weight (Comparative Example 19) of zinc oxide to 100 parts by weight of each of the prepared flame-retardant stabilized red phosphorus.

Besides, each masterbatch consisting of 30 parts by weight of the obtained mixture powder, 35 parts by weight of aluminum hydroxide (SUMITOMO CHEMICAL, CL-310) as an inorganic base flame retardant, and 35 parts by weight of a novolac type phenol resin (a curing agent manufactured by SUMITOMO BAKELITE, PR53195) was prepared.

COMPARATIVE EXAMPLE 20

A red phosphorus base flame-retardant composition was prepared as mixture powder by adding 10 parts by weight of zinc oxide to 100 parts by weight of the flame-retardant stabilized red phosphorus prepared in Comparative Example 12.

Besides, a masterbatch was prepared by uniformly mixing 30 parts by weight of the prepared red phosphorus base flame-retardant composition as the mixture powder, 35 parts by weight of aluminum hydroxide (CL-310 manufactured by SUMITOMO CHEMICAL, an average particle size of 11 $\mu$m) as an inorganic base flame retardant, and 35 parts by weight of a novolac type phenol resin (a curing agent manufactured by SUMITOMO BAKELITE, PR53195).

<Evaluation as Semiconductor Sealing Material>

Using the masterbatches of Examples 15–17 and Comparative Examples 17–20, epoxy resin compositions for a semiconductor sealing material were prepared and evaluated as semiconductor sealing materials.

Epoxy Resin Composition for Semiconductor Sealing Material (Part by Weight)

| | |
|---|---|
| Epoxy resin (YUKA SHELL, YX-4000H) | 113.98 parts |
| Phenol resin (GUN-EI CHEMICAL INDUSTRY, PSM4261) | 61.50 parts |
| Triphenyl phosphine (HOKKO CHEMICAL INDUSTRY) | 2.26 parts |
| OP wax (HOECHST) | 1.13 parts |
| Carbon black (MITSUBISHI CHEMICAL) | 1.13 parts |
| Fused spherical silica (NIPPON CHEMICAL INDUSTRIAL, "SILSTAR M2430") | 820.0 parts |
| Masterbatch | 20.0 parts |

The above components of the epoxy resin composition was mixed by a mixer at normal temperature, and blended by a biaxial heated roller at 80 to 85° C. for seven minutes. Then, peeling, cooling and pulverization were performed to prepare an epoxy resin sealing material.

Using the prepared sealing material, a spiral flow was measured by a transfer molding press under conditions that a molding temperature was 175° C., a molding resin pressure was 7 MPa (70 kg/cm$^2$) and molding time was 120 seconds, and samples of 10 mm×100 mm'3 mm thick were molded as elution test samples. And, test samples of 12.5 mm×125 mm×1 mm thick were molded for a burning test.

Those samples were tested for burning by UL-94, an electric conductivity, and heat promotion of eluted ions by PCT. Results are shown in Table 15.

Besides, humidity resistance and high-temperature storage life were tested, and results are shown in Table 16.

TABLE 15

| | Examples | | | Comparative Examples | | | |
|---|---|---|---|---|---|---|---|
| | 15 | 16 | 17 | 17 | 18 | 19 | 20 |
| Flame-retardant stabilized red Phosphorus (part) | 100 | 100 | 100 | 100 | 100 | 100 | 100 |
| Zinc oxide (part) | 7 | 16 | 10 | — | 7 | 14 | 10 |
| Spiral flow (relative value) | 100 | 100 | 100 | 100 | 100 | 100 | 100 |
| UL-94 | V-0 | V-0 | V-0 | V-0 | V-0 | V-0 | V-0 |
| Eluted PO$_4$ ion (ppm) *1 | 1.4 | 1.1 | 1.2 | 7.3 | 1.6 | 1.2 | 1.5 |
| Eluted PHO$_3$ ion (ppm) *1 | 0.4 | 0.3 | 0.3 | 0.8 | 0.4 | 0.4 | 0.8 |
| Electric conductivity ($\mu$s/cm) *1 | 2.0 | 2.3 | 2.1 | 3.1 | 4.2 | 4.0 | 5.1 |
| Eluted PO$_4$ ion (ppm) *2 | 161 | 90 | 122 | 484 | 165 | 191 | 321 |
| Eluted PHO$_3$ ion (ppm) *2 | 117 | 69 | 93 | 291 | 121 | 172 | 115 |
| Electric conductivity ($\mu$s/cm) *2 | 68 | 43 | 65 | 181 | 145 | 140 | 172 |

(Note)
In the above table, *1 and *2 indicate measuring conditions 80° C. × 20 hrs and 150° C. × 20 hrs, respectively.

It is apparent from Table 15 that when the sealing material is prepared by adding zinc oxide to mix with the flame-retardant stabilized red phosphorus having an electric conductivity of 30 $\mu$s/cm or below as the 10% slurry, eluted ions from the epoxy resin mold product is low and the electric conductivity is also low.

TABLE 16

| | | Examples | | | Comparative Examples | | | |
|---|---|---|---|---|---|---|---|---|
| | | 15 | 16 | 17 | 17 | 18 | 19 | 20 |
| Humidity resistance | 600 hours | 0/10 | 0/10 | 0/10 | 1/10 | 2/10 | 2/10 | 1/10 |
| | 800 hours | 0/10 | 0/10 | 0/10 | 2/10 | 4/10 | 4/10 | 2/10 |
| | 1000 hours | 0/10 | 0/10 | 0/10 | 5/10 | 5/10 | 5/10 | 4/10 |
| | 1200 hours | 0/10 | 0/10 | 0/10 | 8/10 | 8/10 | 8/10 | 5/10 |
| High-temp. storage life | 400 hours | 0/10 | 0/10 | 0/10 | 5/10 | 2/10 | 2/10 | 2/10 |
| | 600 hours | 0/10 | 0/10 | 0/10 | 8/10 | 4/10 | 4/10 | 3/10 |
| | 800 hours | 0/10 | 0/10 | 0/10 | 10/10 | 5/10 | 5/10 | 4/10 |
| | 1000 hours | 0/10 | 0/10 | 0/10 | 10/10 | 8/10 | 8/10 | 7/10 |

(Note)
The above table shows ten samples tested for evaluation and the number of defective samples.

INDUSTRIAL APPLICABILITY

As described above, the red phosphorus base flame retardant for an epoxy resin and the red phosphorus base flame-retardant composition for an epoxy resin of the present invention can be applied as a flame retardant in fields requiring electrical characteristics, and especially when they are contained as a flame retardant into an epoxy resin for a semiconductor sealing material, the epoxy resin composition for a semiconductor sealing material excelling in flame retardancy can be obtained while keeping the electrical reliability.

The epoxy resin composition for a semiconductor sealing material of the present invention has remarkable flame retardancy and electrical reliability, so that it has an effect useful to provide flame retardancy to a sealing material, a molding material, a casting material, an adhesive agent, an electrical insulation coating material, a laminated plate, a printed circuit board, a flat cable, etc. which are used for various types of semiconductor integrated circuits (ICs) and individual semiconductors such as transistors and diodes. And its sealing material can be used to obtain a semiconductor device excelling in flame retardancy and electrical reliability.

What is claimed is:

1. A red phosphorus base flame retardant for an epoxy resin, comprising coated red phosphorus which has the surface of red phosphorus particles coated with a thermosetting resin containing an anhydrous zinc compound, wherein said coated red phosphorus has properties that its slurry prepared by dispersing in 10% by weight into water at 20° C. has an electric conductivity of 30 $\mu$s/cm or below, said slurry which is left standing at 80° C. for 20 hours has an electric conductivity of 150 $\mu$s/cm or below, and when 80 ml of water is added to 8 g of said coated red phosphorus and heated at 80° C. for 20 hours, a concentration of PO$_4$ ions eluted is 10 ppm or below.

2. The red phosphorus base flame retardant for an epoxy resin according to claim 1, wherein when 80 ml of water is added to 8 g of said coated red phosphorus and heated at 80° C. for 20 hours, a concentration of PHO$_3$ ions eluted is 300 ppm or below.

3. The red phosphorus base flame retardant for an epoxy resin according to claim 1, wherein said coated red phosphorus has properties that its slurry prepared by dispersing in 10% by weight into water and left standing at 150° C. for 20 hours has an electric conductivity of 2000 μs/cm or below, and when 80 ml of water is added to 8 g of said coated red phosphorus and heated at 150° C. for 20 hours, a concentration of $PO_4$ ions eluted is 800 ppm or below.

4. The red phosphorus base flame retardant for an epoxy resin according to claim 3, wherein when 80 ml of water is added to 8 g of said coated red phosphorus and heated at 150° C. for 20 hours, a concentration of $PHO_3$ ions eluted is 1500 ppm or below.

5. The red phosphorus base flame retardant for an epoxy resin according to claim 1, wherein said coated red phosphorus has an average particle size of 1 to 50 μm.

6. The red phosphorus base flame retardant for an epoxy resin according to claim 5, wherein said coated red phosphorus has an average particle size of 1 to 50 μm and a maximum particle size of 150 μm or below.

7. The red phosphorus base flame retardant for an epoxy resin according to claim 5, wherein said coated red phosphorus has an average particle size of 1 to 10 μm and a maximum particle size of 20 μm or below.

8. The red phosphorus base flame retardant for an epoxy resin according to claim 1, wherein said coated red phosphorus has a red phosphorus content of 65 to 97% by weight.

9. The red phosphorus base flame retardant for an epoxy resin according to claim 1, wherein said coated red phosphorus has a thermosetting resin content of 0.5 to 20% by weight.

10. The red phosphorus base flame retardant for an epoxy resin according to claim 1 or 9, wherein said thermosetting resin is a phenol resin.

11. The red phosphorus base flame retardant for an epoxy resin according to claim 1, wherein said coated red phosphorus contains an anhydrous zinc compound of 50 to 1000 parts by weight relative to 100 parts by weight of the thermosetting resin.

12. The red phosphorus base flame retardant for an epoxy resin according to claim 1, wherein said anhydrous zinc compound has an average particle size of 2 μm or below.

13. The red phosphorus base flame retardant for an epoxy resin according to claim 12, wherein said anhydrous zinc compound has an average particle size of 0.2 to 1 μm.

14. The red phosphorus base flame retardant for an epoxy resin according to claim 1, wherein said anhydrous zinc compound is zinc oxide.

15. An epoxy resin composition for a semiconductor sealing material, comprising the red phosphorus base flame retardant for an epoxy resin according to claim 1.

16. An epoxy resin composition for a semiconductor sealing material according to claim 15, wherein said red phosphorus base flame retardant for an epoxy resin is contained in 0.05 to 5% by weight relative to the epoxy resin composition.

17. The epoxy resin composition for a semiconductor sealing material according to claim 15, further comprising an epoxy resin, a curing agent and an inorganic filler.

18. A masterbatch for an epoxy resin composition for a semiconductor sealing material, wherein a resin contains the red phosphorus base flame retardant for an epoxy resin according to claim 1.

19. A semiconductor sealing material, comprising the epoxy resin composition for a semiconductor sealing material according to claim 15.

20. A semiconductor device, comprising the semiconductor sealing material according to claim 19.

21. A method of manufacturing a red phosphorus base flame retardant for an epoxy resin, comprising the following steps (A1) to (A3):

(A1) washing red phosphorus particles with at least one or more selected from acids and alkalis;

(A2) obtaining coated red phosphorus by adding an anhydrous zinc compound and a synthetic material of a thermosetting resin or its prepolymer to a slurry having said washed red phosphorus particles dispersed into water, and performing a polymerization reaction to coat the surface of red phosphorus particles with the thermosetting resin containing the anhydrous zinc compound; and (A3) obtaining the red phosphorus base flame retardant for an epoxy resin by washing the coated red phosphorus with pure water so that a slurry having the coated red phosphorus dispersed in 10% by weight into water at 20° C. has an electric conductivity of 30 μs/cm or below.

22. The method of manufacturing a red phosphorus base flame retardant for an epoxy resin according to claim 21, wherein said red phosphorus particles have an average particle size of 1 to 50 μm and 10% by weight or below of particles having a particle size of less than 1μm.

23. The method of manufacturing a red phosphorus base flame retardant for an epoxy resin according to claim 21, wherein said red phosphorus particles have an average particle size of 1 to 50 μm, a maximum particle size of 150 μm or below, and 10% by weight or below of particles having a particle size of less than 1 μm.

24. The method of manufacturing a red phosphorus base flame retardant for an epoxy resin according to claim 21, wherein said red phosphorus particles have an average particle size of 1 to 10 μm, a maximum particle size of 20 μm or below, and 10% by weight or below of particles having a particle size of less than 1 μm.

25. A red phosphorus base flame retardant for an epoxy resin, comprising double-coated red phosphorus which has the surface of red phosphorus particles coated with an inorganic substance and further coated with a thermosetting resin containing an anhydrous zinc compound, wherein the double-coated red phosphorus has properties that its slurry prepared by dispersing in 10% by weight into water at 20° C. has an electric conductivity of 30 μs/cm or below, said slurry which is left standing at 80° C. for 20 hours has an electric conductivity of 150 μs/cm or below, and when 80 ml of water is added to 8 g of said double-coated red phosphorus and heated at 80° C. for 20 hours, a concentration of $PO_4$ ions eluted is 10 ppm or below.

26. The red phosphorus base flame retardant for an epoxy resin according to claim 25, wherein when 80 ml of water is added to 8 g of said double-coated red phosphorus and heated at 80° C. for 20 hours, a concentration of $PHO_3$ ions eluted is 300 ppm or below.

27. The red phosphorus base flame retardant for an epoxy resin according to claim 25, wherein said double-coated red phosphorus has properties that its slurry prepared by dispersing in 10% by weight into water and left standing at 150° C. for 20 hours has an electric conductivity of 2000 μs/cm or below, and when 80 ml of water is added to 8 g of said double-coated red phosphorus and heated at 150° C. for 20 hours, a concentration of $PO_4$ ions eluted is 800 ppm or below.

28. The red phosphorus base flame retardant for an epoxy resin according to claim 27, wherein when 80 ml of water is added to 8 g of said double-coated red phosphorus and heated at 150° C. for 20 hours, a concentration of $PHO_3$ ions eluted is 1500 ppm or below.

29. The red phosphorus base flame retardant for an epoxy resin according to claim 25, wherein said double-coated red phosphorus has an average particle size of 1 to 50 μm.

30. The red phosphorus base flame retardant for an epoxy resin according to claim 29, wherein said double-coated red phosphorus has an average particle size of 1 to 50 µm and a maximum particle size of 150 µm or below.

31. The red phosphorus base flame retardant for an epoxy resin according to claim 29, wherein said double-coated red phosphorus has an average particle size of 1 to 10 µm and a maximum particle size of 20 µm or below.

32. The red phosphorus base flame retardant for an epoxy resin according to claim 25, wherein said double-coated red phosphorus has a red phosphorus content of 65 to 97% by weight.

33. The red phosphorus base flame retardant for an epoxy resin according to claim 25, wherein said double-coated red phosphorus has the surface of red phosphorus particles coated with an inorganic substance formed of metal hydroxide or oxide of at least one selected from Zn, Al, Mg, Si, Co, Zr, Ti and Sn.

34. The red phosphorus base flame retardant for an epoxy resin according to claim 25, wherein said double-coated red phosphorus has an inorganic substance content of 0.5 to 20 parts by weight relative to 100 parts by weight of red phosphorus.

35. The red phosphorus base flame retardant for an epoxy resin according to claim 25, wherein said double-coated red phosphorus has a thermosetting resin content of 0.5 to 20% by weight.

36. The red phosphorus base flame retardant for an epoxy resin according to claim 25, wherein said thermosetting resin is a phenol resin.

37. The red phosphorus base flame retardant for an epoxy resin according to claim 25, wherein said coated red phosphorus has an anhydrous zinc compound content of 50 to 1000 parts by weight relative to 100 parts by weight of the thermosetting resin.

38. The red phosphorus base flame retardant for an epoxy resin according to claim 25, wherein said anhydrous zinc compound has an average particle size of 2 µm or below.

39. The red phosphorus base flame retardant for an epoxy resin according to claim 38, wherein said anhydrous zinc compound has an average particle size of 0.2 to 1 µm.

40. The red phosphorus base flame retardant for an epoxy resin according to claim 25, wherein said anhydrous zinc compound is zinc oxide.

41. An epoxy resin composition for a semiconductor sealing material, comprising the red phosphorus base flame retardant for an epoxy resin according to claim 25.

42. An epoxy resin composition for a semiconductor sealing material according to claim 41, wherein said red phosphorus base flame retardant for an epoxy resin is contained in an amount of 0.05 to 5% by weight relative to the epoxy resin composition.

43. The epoxy resin composition for a semiconductor sealing material according to claim 41, further comprising an epoxy resin, a curing agent and an inorganic filler.

44. A masterbatch for an epoxy resin composition for a semiconductor sealing material, wherein a resin contains the red phosphorus base flame retardant for an epoxy resin according to claim 25.

45. A semiconductor sealing material, comprising the epoxy resin composition for a semiconductor sealing material according to claim 41.

46. A semiconductor device, comprising the semiconductor sealing material according to claim 45.

47. A method of manufacturing a red phosphorus base flame retardant for an epoxy resin, comprising the following steps (B1) to (B5):
(B1) washing red phosphorus particles with at least one or more selected from acids and alkalis;
(B2) coating the surface of red phosphorus particles with an inorganic substance formed of metal hydroxide or oxide by adding a water-soluble metallic salt and an alkaline agent to a slurry having the washed red phosphorus particles dispersed into water;
(B3) washing the red phosphorus particles coated with said inorganic substance with pure water;
(B4) obtaining double-coated red phosphorus by adding an anhydrous zinc compound and a synthetic material of a thermosetting resin or its prepolymer to a slurry having the washed red phosphorus particles coated with the inorganic substance dispersed into water, and performing a polymerization reaction to coat the surface of red phosphorus particles, which is coated with the inorganic substance, with the thermosetting resin containing the anhydrous zinc compound; and
(B5) obtaining the red phosphorus base flame retardant for an epoxy resin by washing the double-coated red phosphorus with pure water so that a slurry having the double-coated red phosphorus dispersed in 10% by weight into water at 20° C. has an electric conductivity of 30 µs/cm or below.

48. The method of manufacturing a red phosphorus base flame retardant for an epoxy resin according to claim 47, wherein said step (B3) washes the red phosphorus particles coated with the inorganic substance with pure water until a slurry having said red phosphorus particles dispersed in 10% by weight into water has an electric conductivity of 1000 µs/cm or below.

49. The method of manufacturing a red phosphorus base flame retardant for an epoxy resin according to claim 47, wherein said red phosphorus particles have an average particle size of 1 to 50 µm and 10% by weight or below of particles having a particle size of less than 1 µm.

50. The method of manufacturing a red phosphorus base flame retardant for an epoxy resin according to claim 47, wherein said red phosphorus particles have an average particle size of 1 to 50 µm, a maximum particle size of 150 µm or below, and 10% by weight or below of particles having a particle size of less than 1 µm.

51. The method of manufacturing a red phosphorus base flame retardant for an epoxy resin according to claim 47, wherein said red phosphorus particles have an average particle size of 1 to 10 µm, a maximum particle size of 20 µm or below, and 10% by weight or below of particles having a particle size of less than 1 µm.

* * * * *